United States Patent [19]
Sokol

[11] Patent Number: 5,572,082
[45] Date of Patent: Nov. 5, 1996

[54] MONOLITHIC CRYSTAL STRIP FILTER

[76] Inventor: Thomas J. Sokol, 442 Twisting Pine Cir., Longwood, Fla. 32779

[21] Appl. No.: 340,043

[22] Filed: Nov. 14, 1994

[51] Int. Cl.$^6$ .................................................. H01L 41/08
[52] U.S. Cl. .......................... 310/366; 310/348; 310/361; 333/192
[58] Field of Search ..................... 310/348, 361, 310/365, 366, 368; 333/186–192

[56] References Cited

U.S. PATENT DOCUMENTS

| | | | |
|---|---|---|---|
| 3,805,098 | 4/1974 | Carpenter et al. | 310/348 |
| 3,970,880 | 7/1976 | Deutschmann et al. | 310/348 |
| 4,247,797 | 1/1981 | Echigo et al. | 310/361 |
| 4,292,562 | 9/1981 | Feder | 310/348 |
| 4,306,170 | 12/1981 | Motte et al. | 310/361 |
| 4,329,666 | 5/1982 | Arvanitis | 333/191 |
| 4,450,378 | 5/1984 | Hermann et al. | 310/361 |
| 4,454,444 | 6/1984 | Fujiwara et al. | 310/360 |
| 4,455,502 | 6/1984 | Nakatani | 310/368 |
| 4,455,503 | 6/1984 | Nakatani | 310/368 |
| 4,484,158 | 11/1984 | Roberts et al. | 333/191 |
| 4,503,352 | 3/1985 | Inoue | 310/339 |
| 4,642,511 | 2/1987 | Chason et al. | 310/348 |
| 4,757,581 | 7/1988 | Yamada et al. | 29/23.35 |
| 4,926,086 | 5/1990 | Bourgeois et al. | 310/361 |
| 5,281,935 | 1/1994 | Knecht et al. | 333/187 |

FOREIGN PATENT DOCUMENTS

| | | | |
|---|---|---|---|
| 0620640 | 10/1994 | European Pat. Off. | 333/191 |
| 0149520 | 11/1980 | Japan | 333/191 |
| 0153632 | 8/1985 | Japan | 310/361 |
| 0092017 | 5/1986 | Japan | 333/187 |
| 0318311 | 12/1989 | Japan | 333/187 |
| 4222109 | 8/1992 | Japan | 333/187 |
| 4284012 | 10/1992 | Japan | 333/187 |
| 5090870 | 4/1993 | Japan | 333/187 |
| 5259804 | 10/1993 | Japan | 333/189 |
| 6045868 | 2/1994 | Japan | 333/190 |
| 6177702 | 6/1994 | Japan | 333/190 |

OTHER PUBLICATIONS

Crystal Filters–Design, Manufacture and Application, by Robert G. Kinsman.

Primary Examiner—Thomas M. Dougherty
Attorney, Agent, or Firm—Jeffrey S. Sokol

[57] ABSTRACT

The present invention relates to a low profile monolithic crystal strip filter and filter package. The filter includes an AT-cut rectangular strip of quartz crystal. The filter further includes input, output and ground electrodes which are formed in a symmetrical pattern on the strip. Each electrode is connected to its respective mounting or ground contact by a flag. The electrodes, contacts and flags have a predetermined size and shape, and are arranged in a predetermined configuration on the crystal strip to minimize spurious responses and insertion losses. The crystal strip is mounted to an HC-45 or HC-49 base to minimize production costs. The output signal of the filter has a center frequency of about 4 to 500 MHz, a 3 dB bandwidth of about 3 to 250 kHz, an ultimate of better than 60 dB, standard insertion losses for the number of poles in the filter and commercially acceptable spurious responses.

23 Claims, 12 Drawing Sheets

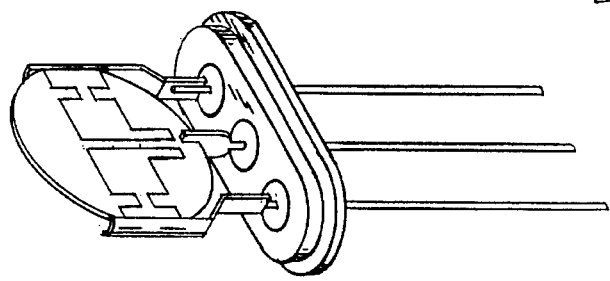
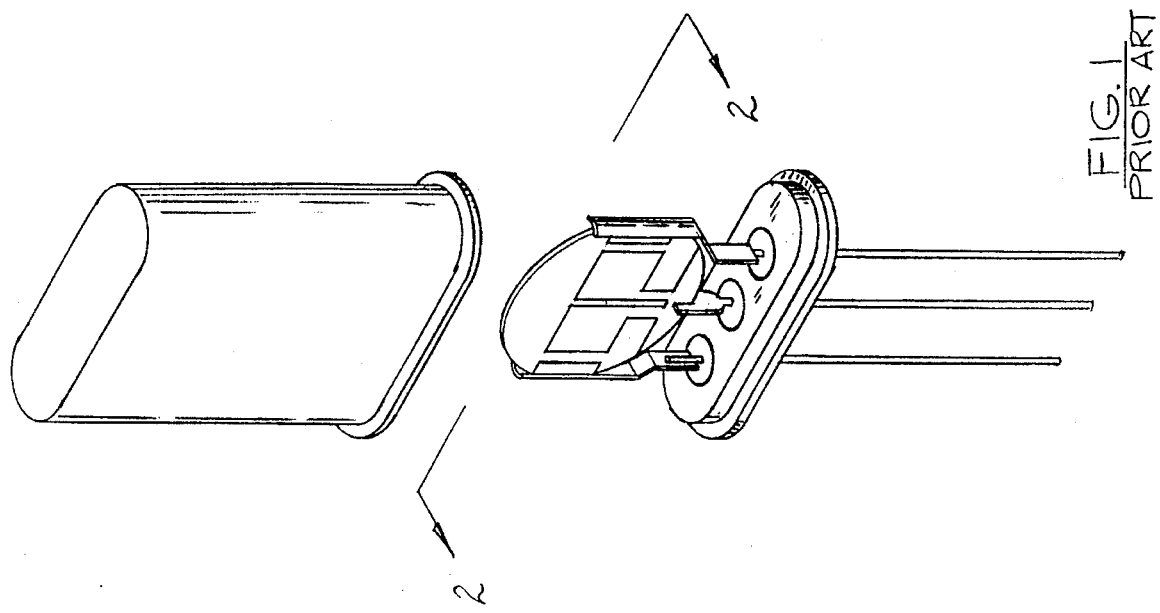

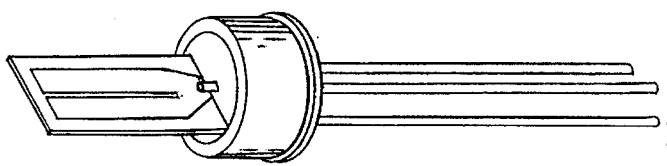
FIG. 6
PRIOR ART
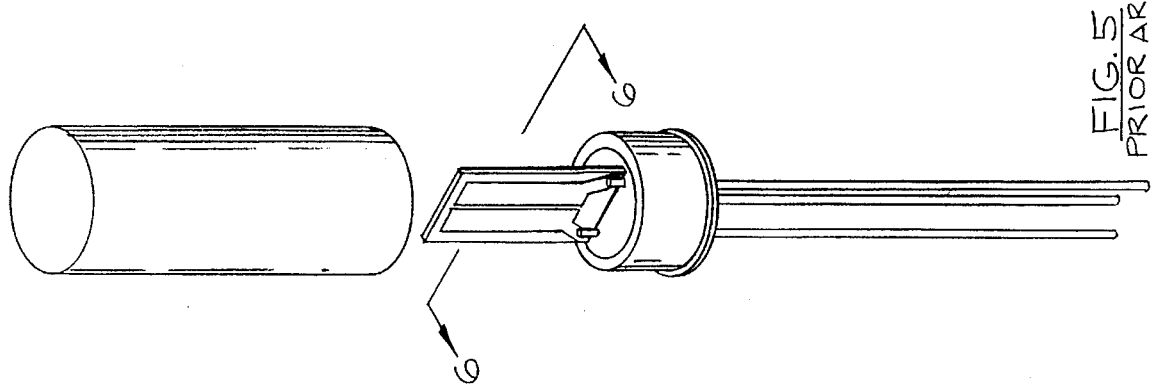
FIG. 5
PRIOR ART
FIG. 4
PRIOR ART
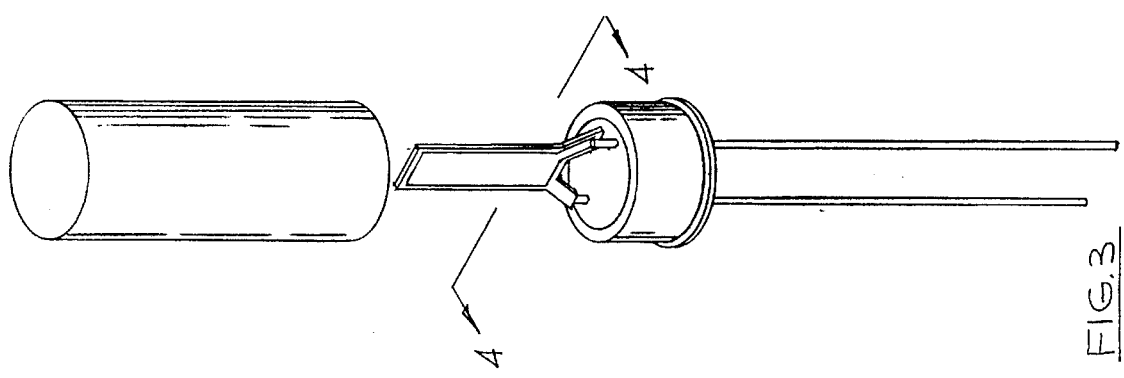
FIG. 3
PRIOR ART

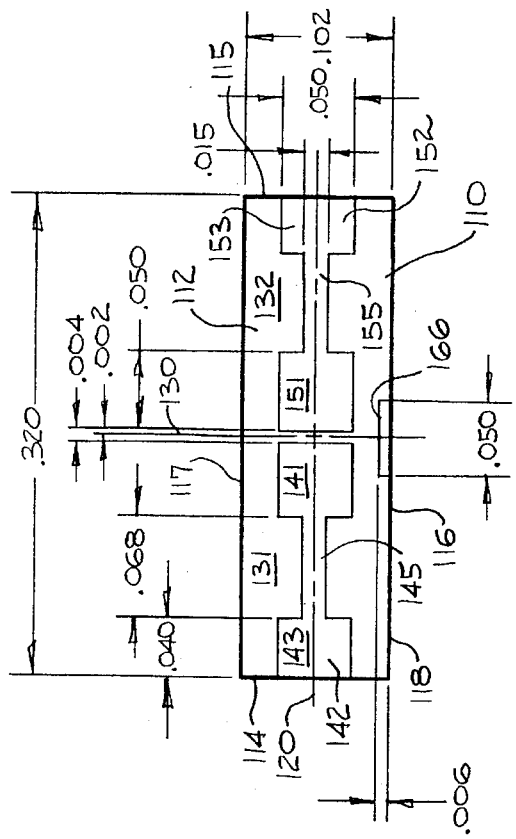
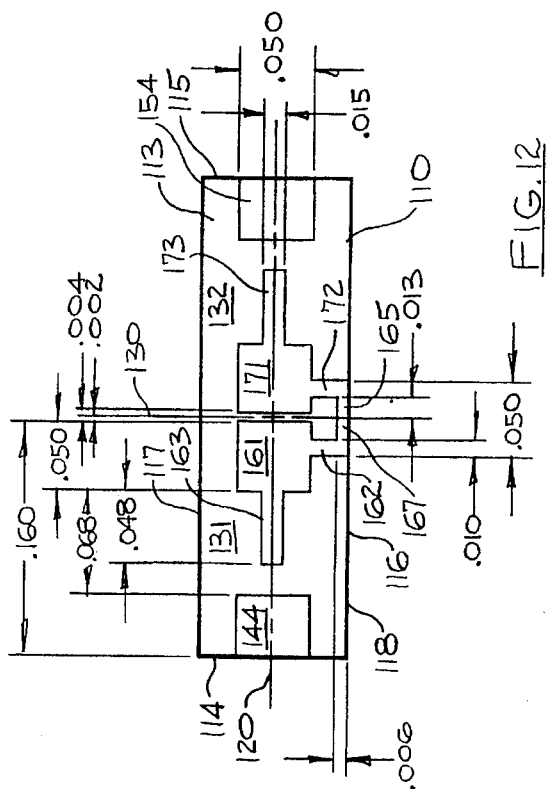
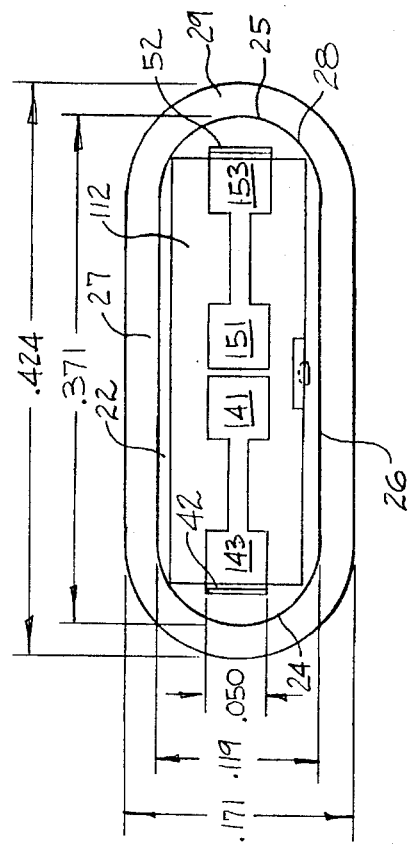
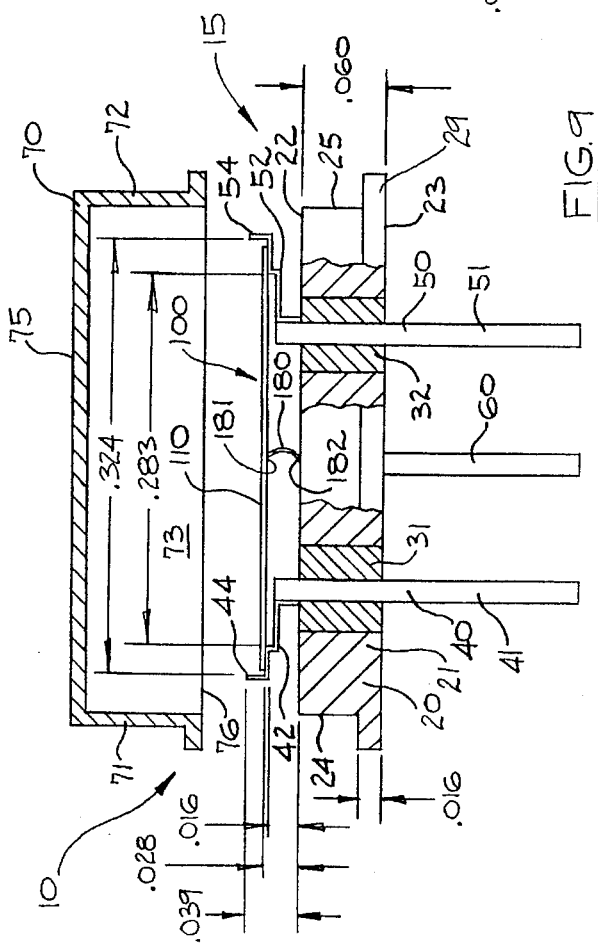

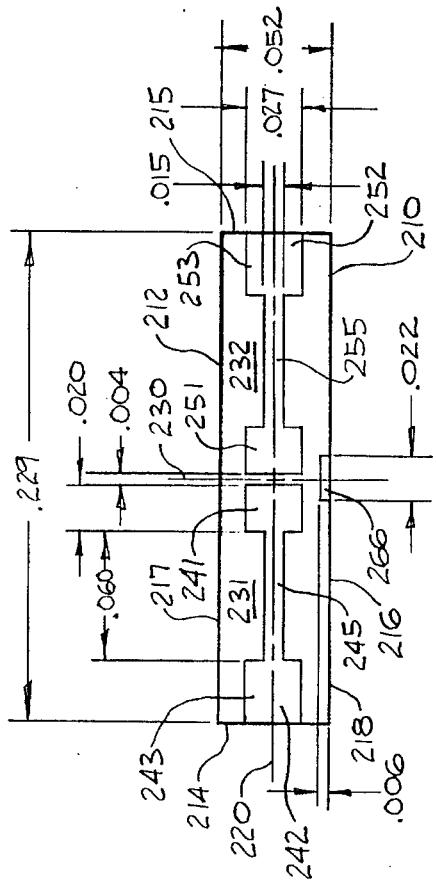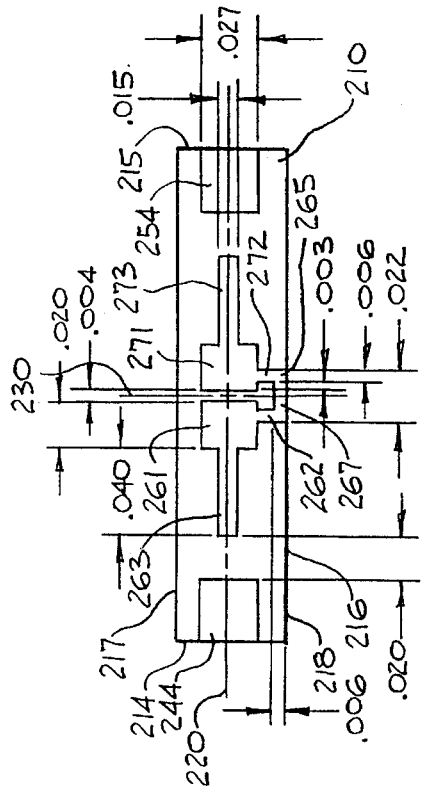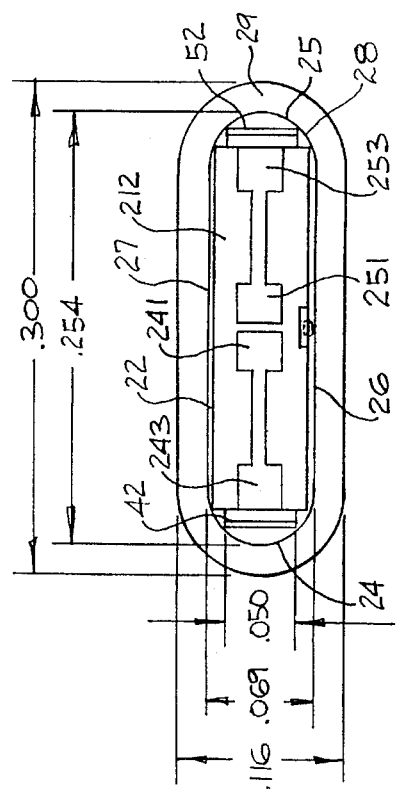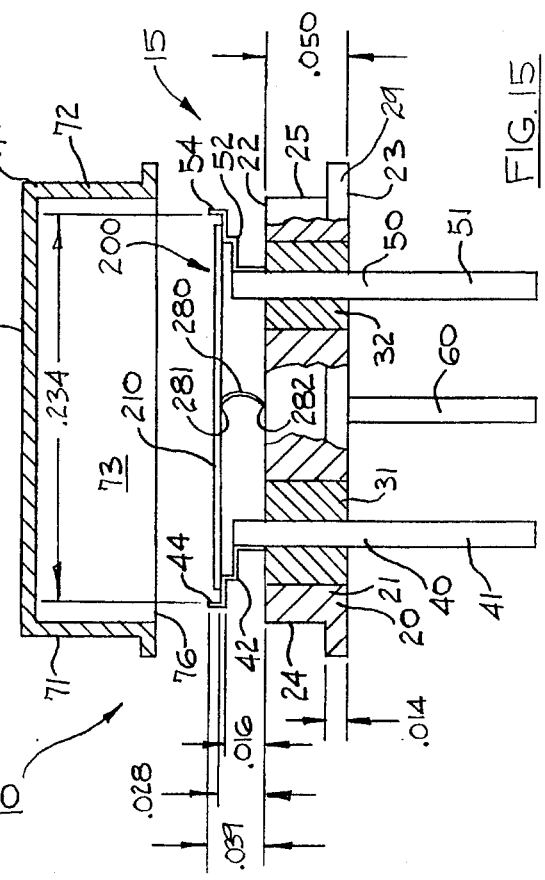

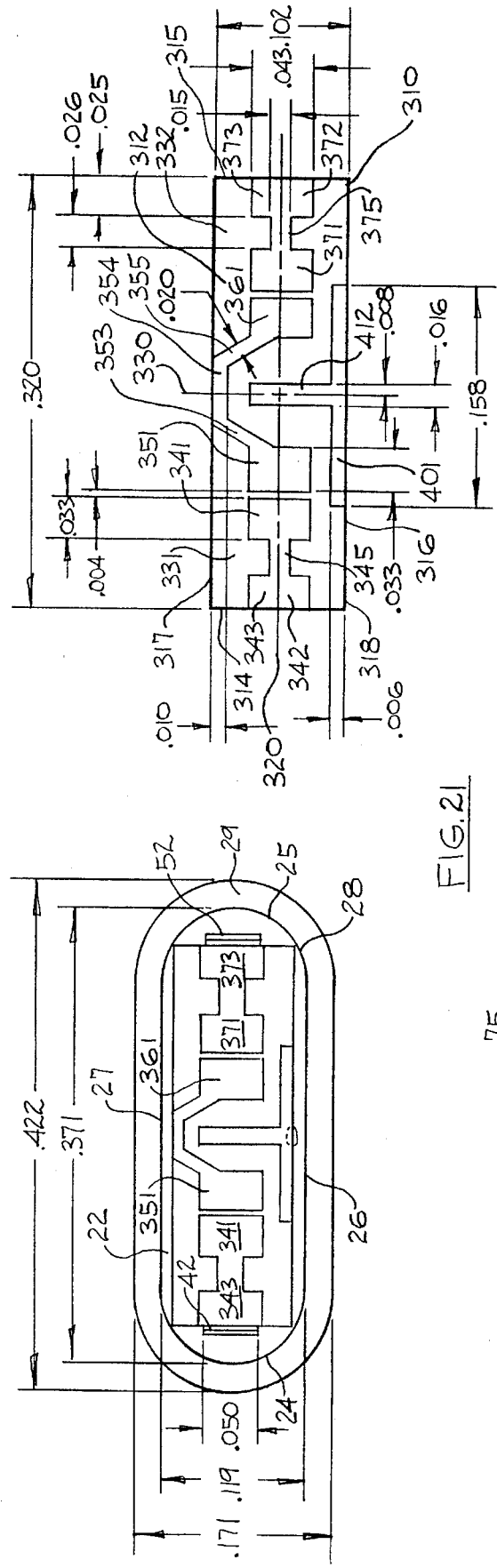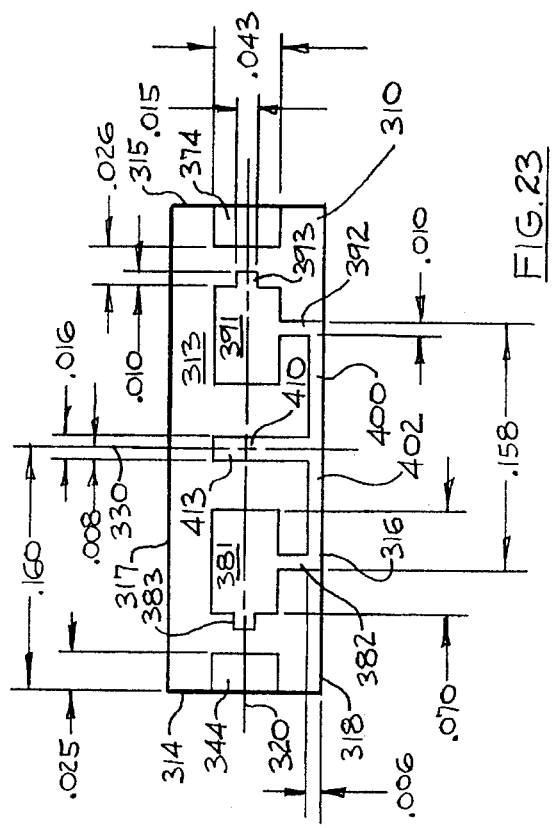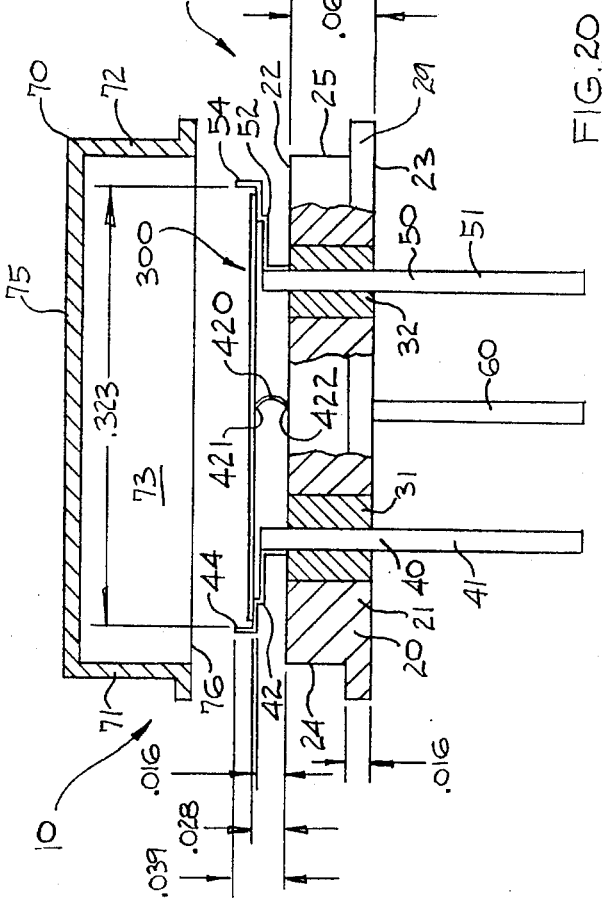

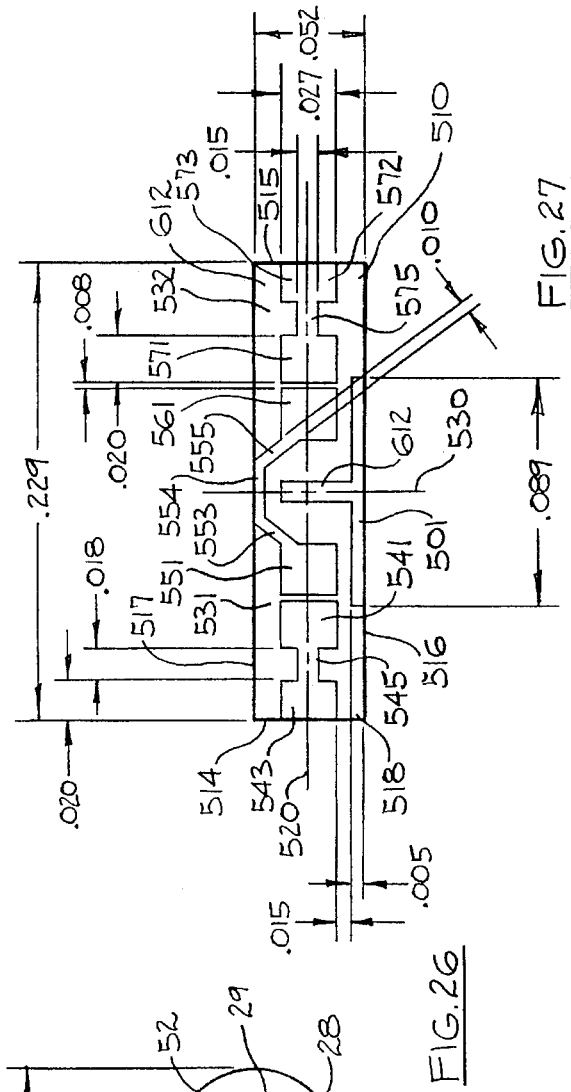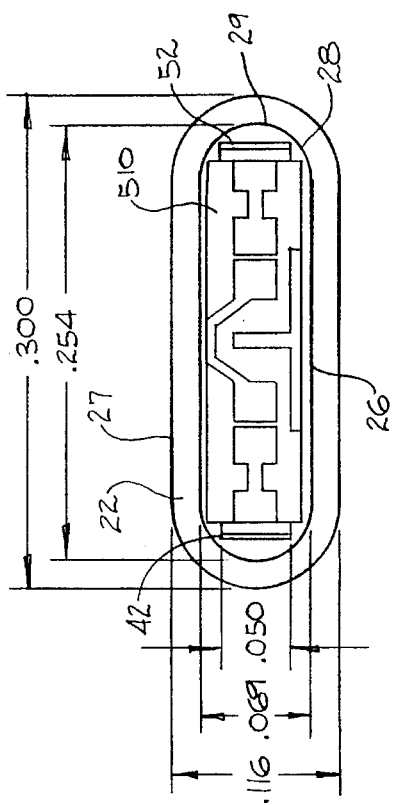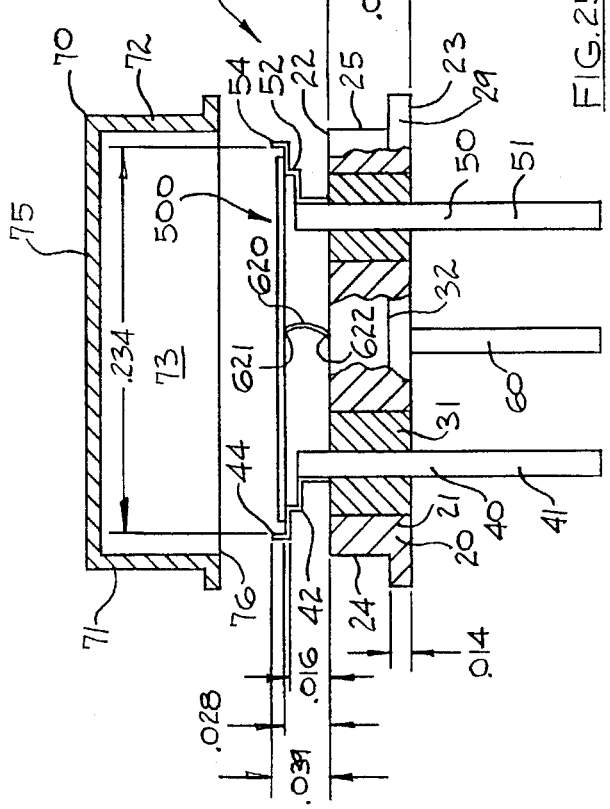

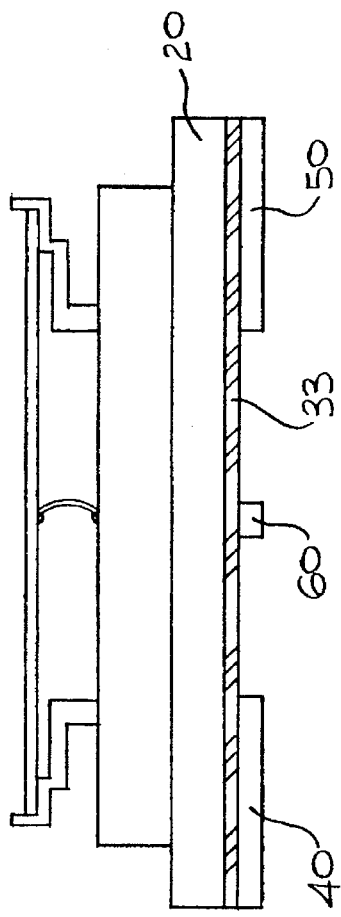
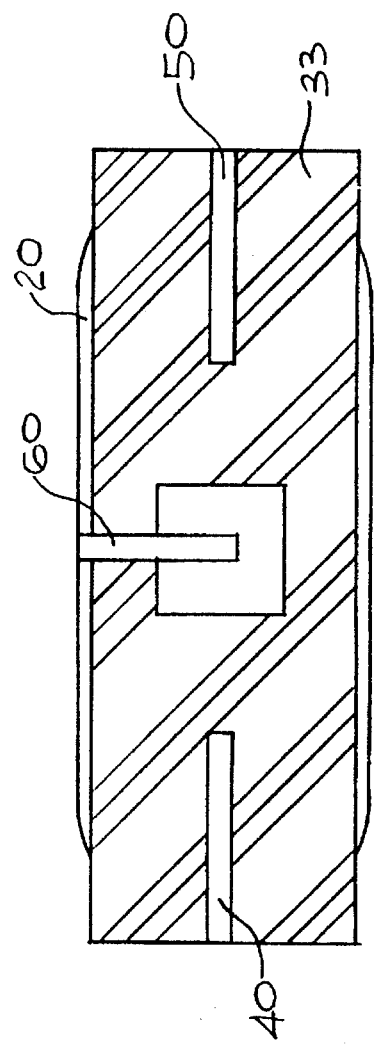

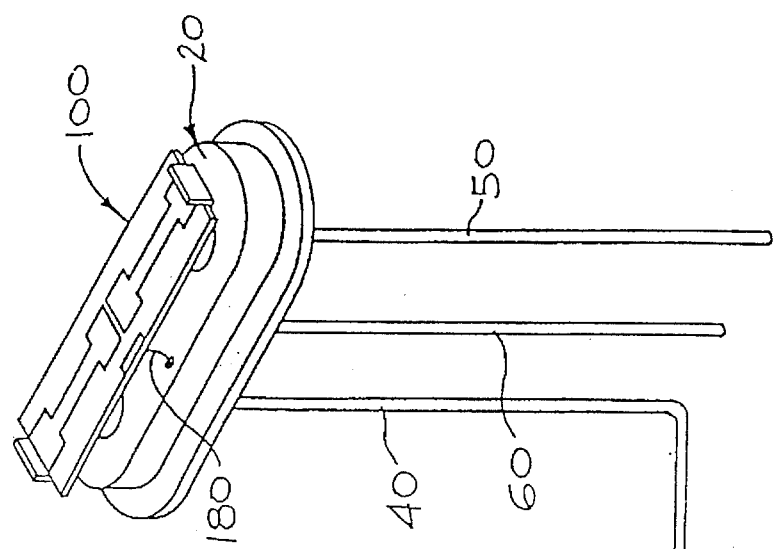
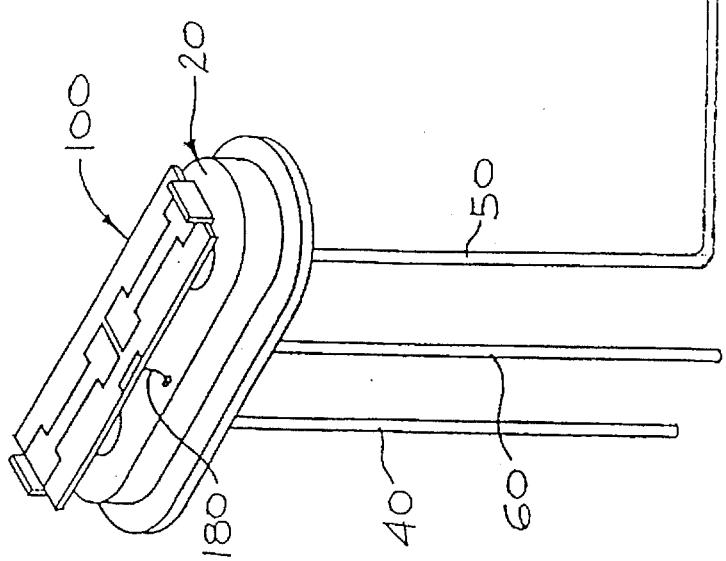
FIG. 31

MONOLITHIC CRYSTAL STRIP FILTER

TECHNICAL FIELD

The present invention relates to a monolithic filter utilizing a strip of quartz crystal. The monolithic filter is particularly useful in miniaturized electronic equipment where low profile and minimum circuit board real estate are a concern.

BACKGROUND

A primary objective of electronics today is the miniaturization of equipment while maximizing performance per unit price. This objective is especially important in electronic communications equipment where size and weight are a concern. Cellular telephones and radios for aircraft and land vehicles are but a few examples of devices wherein miniaturization is a major objective. An important component in many communications devices is a monolithic filter that allows a desired signal at a specific frequency to pass into the electronic device while filtering out unwanted signals.

FIGS. 1 and 2 illustrate a standard two-pole monolithic crystal filter package containing a crystal blank, a base upon which the crystal blank is mounted and a can or cover for enclosing the crystal blank. As should be understood, the crystal blank is relatively large and round and resembles the shape of a circular-like disk. The crystal disk is mounted in a substantially perpendicular orientation relative to the base so that the resulting height dimension of the filter package is greater than the diameter of the disk. Input and output electrodes are formed near the center of one surface of the disk. Ground electrodes are formed on an opposite surface of the disk and are disposed in substantial registry with the input and output electrodes. Ground and mounting contacts are formed at specific locations along the perimeter of the disk. The electrodes are electrically connected to the contacts by thin "flags" formed on the surface of the disk. Commercially available monolithic crystal disk filters are available in multiple pole designs, such as two-pole, four-pole, six-pole, eight-pole, etc.

Many factors must be taken into account when designing a monolithic filter having a specific output signal performance. Monolithic filters are typically designed to have an output signal with a specific center frequency and bandwidth. The filters are also designed to produce an output signal with predetermined levels of ultimate attenuation, insertion loss (loss of output signal strength) and spurious responses (unwanted output signal responses). For example, electrical devices operating on a principle of amplitude modulation (AM) require a narrower bandwidth than devices operating on a principle of frequency modulation (FM). Similarly, devices operating on FM require a narrower bandwidth than devices operating on pulse modulation (PM).

Bandwidth or bandpass is a function of electrode separation, length of electrode and thickness of the crystal blank and plated elements. The closer the electrodes are together, the wider the bandwidth of the output signal. The thicker the crystal blank, the lower the center frequency and the wider the bandwidth of the output signal. Insertion losses are typically greater for output signals with narrow bandwidths due to the increase in Q of the circuit. Spurious responses are typically more active for output signals with wide bandwidths. A more complete discussion of crystal filter design can be found in the book entitled Crystal Filters—Design, Manufacture, and Application authored by Robert G. Kinsman and published by John Wiley & Sons, Inc. in 1987, the substance of which is incorporated by reference herein.

The size and shape of the crystal blank are important limitations when designing a miniaturized monolithic crystal filter. The closer the electrodes are to the contacts or the edges of the blank, the greater the insertion losses and spurious responses will typically be. In standard crystal filter designs, the electrodes are typically no closer to the edge of the blank than ten times the thickness of the blank. As noted above, the output signal bandwidth is also a function of the distance between the input and output electrodes. The electrode pairs must be spaced apart the most for low frequency, narrow bandwidth filters. The size of the electrodes must also be taken into consideration. The larger the area of the electrodes, typically the lower the center frequency of the output signal. The longer the electrodes, typically the narrower the bandwidth.

One problem with commercially available monolithic filter designs is the size and shape of the crystal disk. The large size and round shape of the disk contained in conventional crystal filters is detrimental to the miniaturization of electronic devices. This specific problem has become even more pronounced in recent years given the trend in the electronics industry to split a single circuit board containing a large number of components into several separate circuit boards containing a portion of the components. These separate circuit boards are then stacked, one on top of the other, to effectuate the miniaturization of the electronics devices. As should be appreciated, the distance between the circuit boards is often dictated by the height of the monolithic crystal filter.

Many attempts have been made to reduce the height of monolithic filters. More specifically, the electronics industry has attempted to install monolithic crystal disk filters in ceramic chip carriers. However, even after substantial research and capital expenditures, the amount of circuit board space or real estate consumed by the ceramic chip carriers continues to be too large. As should be understood, circuit board real estate is the surface area of the circuit board consumed by a given component, such as the monolithic filter and similar assemblies. The combined cost of the ceramic chip carrier and the increase in real estate consumed by the ceramic chip carrier more than offsets the costs and benefits obtained by the reduction in height for commercial production purposes.

The electronics industry also attempted to substitute monolithic crystal disk filters with surface acoustic wave (SAW) filters. However, SAW filters are proving to be unsuitable for many purposes. For example, the center frequency of a standard SAW filter drifts with changes in temperature. These filters are generally used in applications experiencing a narrow temperature range of between 20° C. to 50° C. Commercial applications typically require filter output stability between a larger range of temperature −30° C. to 70° C., and military applications require a temperature stability between −40° C. to 85° C.

The electronics industry has also attempted to reduce the height of monolithic crystal disk filter packages themselves. As best shown in FIGS. 1 and 2, these filter packages have input and output posts or leads that project from the lower surface of the base. These posts can be bent so that both the crystal disk and the filter package lay flat against or parallel to the circuit board. Unfortunately, these same designs are not readily mountable to circuit boards, especially by conventional surface mount pick-and-place machines which are widely employed in this industry segment. Other designs have included a crystal disk mounted in a substantially parallel orientation relative to the filter base. An example of such a design is shown in U.S. Pat. No. 5,281,935, the disclosure of which is incorporated by reference herein. The most noteworthy problem associated with these designs, however, is that the monolithic crystal disk filter packages take up a great deal of circuit board real estate when the large crystal disk is positioned in a substantially parallel orientation relative to the circuit board. Again, the costs and associate benefits of the reduction in filter height is viewed as being offset by the costs attendant to the increase in real estate consumed by the individual filters.

Other attempts in the art were made to modify commercially available end mounted, discrete crystal strip resonators illustrated in FIGS. 3 and 4 to produce an end mounted, monolithic crystal strip filter shown in FIGS. 5 and 6. Although commercially unsuccessful, these end mounted or tubular monolithic filters would have reduce the real estate consumed by the base of the filter when mounted in an upright orientation on the circuit board. Unfortunately, while commercially acceptable discrete crystal strip resonators are available in both end mounted designs similar to that shown in FIGS. 3 and 4 and low profile designs similar to that illustrated in FIG. 7, to date, no monolithic crystal strip filter exists in either an end mounted or low profile designs.

Another problem encountered with miniaturized monolithic crystal filters is the amount of spurious responses and insertion loses which are associated with the output signal. One reason for increases in spurious responses and insertion loses is believed to be the close placement of the electrodes relative to the mounting and ground contacts as a result of the reduced size of the crystal blank. As should be understood, small crystal blanks simply do not provide a great deal of surface area within which to position various components when designing specific monolithic filters which are intended for particular applications.

A further problem faced by the electronics industry is maintaining a competitive price for miniaturized crystal filters. This requires particular attention to the costs associated with manufacturing the individual miniaturized filters. To minimize manufacturing expenses, monolithic crystal filter designs should utilize standard bases, such as HC-45, HC-49 or UM-1 base designs. The miniaturized filter should further be mountable on the base without extensive modification of the base or to the machines employed to manufacture the base. Filter designs that require substantial retooling of these manufacturing machines prior to commercial production result in dramatic increases in the cost of the miniaturized filters which normally renders the filters impractical for commercial purposes.

A still further problem faced by the electronics industry is that miniaturized crystal filters should be adapted for installation on existing circuit boards without significant redesign of the component layout of the circuit boards. As would be expected, modifications to the existing circuit board designs can dramatically increase the cost of employing the miniaturized filter, and thus the cost of the electronic devices utilizing the filter.

The present invention is provided to solve these and other problems.

SUMMARY OF THE INVENTION

The present invention relates to a low profile monolithic crystal strip filter and filter package. More specifically, the filter includes an AT-cut rectangular strip of quartz crystal having a length of about ⅓ to ¼ of an inch; a width of about ⅒ to ¹⁄₂₀ of an inch; and a thickness of about ⁵⁄₁₀,₀₀₀ to ¹⁰⁰⁄₁₀,₀₀₀ of an inch. The filter includes input, output, and ground electrodes formed symmetrically on the strip. Each electrode is connected to its respective mounting or ground contact by means of flag. The electrodes, contacts and flags have a predetermined size and shape, and are arranged in a predetermined configuration on the crystal strip to minimize spurious responses and insertion losses. The crystal strip is mounted to an HC-45 or HC-49 base to minimize production costs. A low profile can or cover forms a hermetic seal with the base, thereby enclosing the crystal strip. A ground wire connects the filter ground contact to the base. A ground post projects from a lower surface of the base. The filter can take the form of a two-pole design with a single set of input, output and ground electrodes located symmetrically upon the crystal strip; or a four-pole design with two sets of input, output and ground electrodes located symmetrically on the crystal strip. The output signal has a center frequency of about 4 to 500 MHz, a 3 dB bandwidth of about 3 to 250 kHz, an ultimate of normally better than 60 dB, standard insertion losses for the number of poles in the filter and commercially viable spurious responses.

A major advantage of the present monolithic crystal strip filter invention is that it dramatically reduces the height of commercially available monolithic crystal filter packages without substantially increasing the circuit board real estate consumed by the filter packages. For example, the height of a monolithic crystal filter utilizing a standard HC-45 or UM-1 base design is reduced from about 0.30 inches to about 0.15 inches, or approximately one-half the original height. The height of a filter utilizing a standard HC-49 filter design is reduced from about 0.45 inches to about 0.15 inches, or approximately one-third the height. This low profile design with reduced height enables the circuit boards in electronics devices to be stacked significantly closer together, thereby reducing the overall size and weight of the resulting electronic device employing the filter.

An additional advantage of the present invention is that the relatively small monolithic crystal strip filter produces an output signal having a thermally stable center frequency with a 3 dB bandwidth of about 3 to 250 kHz through center frequencies of about 4 to 500 MHz. The filter also produces standard insertion losses for the number of poles in the filter and spurious responses which are commercially acceptable. This performance is achieved despite the fact that the electrodes have a width of about one-half the width of the strip, and are positioned within distances in the range of five to ten times the thickness of the blank when measured from the edges of the blank. This performance is also achieved despite the fact that the ground contacts are positioned about 0.02 inches from the electrodes, and about 30 to 40 percent of the entire surface of the strip is plated or metalized with electrodes, contacts and flags.

A further advantage of the present invention is that most of the machinery used to manufacture discrete crystal strip resonators can be employed effectively to manufacture the present monolithic crystal strip filter invention in a low profile package. For example, a conventional pick-and-place machine can be used to install the crystal strip filter to the mounting posts of the base.

A still further advantage of the present monolithic crystal strip filter is that it may be installed on an existing HC-45, HC-49 or UM-1 base without requiring the redesign of the base or modification of the equipment employed to install the crystal strip filter on the base. As earlier discussed, the use of the HC-45, HC-49 or UM-1 bases dramatically reduces the costs which are attributable to retooling production equipment, and therefore reduces the manufacturing expenses related to miniaturized monolithic crystal filters.

A still further advantage of the present invention is that the low profile design enables the lower surface of the base to be mounted in substantially parallel relation to an associated circuit board. This mounting orientation is very important from a commercial standpoint because the respective filters can be readily installed on a circuit board by again utilizing a conventional pick-and-place machine after the individual posts of the base are bent or otherwise deformed for surface mounting applications. As should be understood, the use of pick-and-place machines permits rapid, automated, and cost efficient installation of the filter package to an associated circuit board.

A still further advantage of the present invention is that it provides a monolithic crystal strip filter that can be installed in current circuit board designs without significant redesign of the circuit board component layout. This, of course, reduces the costs attendant to incorporating the invention into existing electronics devices and further reduces the final cost of the miniaturized electronic device.

Other features and advantages of the present invention will become readily apparent from the following specification, taken in combination with the following drawings.

BRIEF DESCRIPTION OF DRAWING

FIG. 1 is a perspective, enlarged, exploded, front elevation view of a standard two-pole monolithic crystal disk filter which is mounted on an HC-49 base and which has a standard height can.

FIG. 2 is a perspective, enlarged, rear elevation view of the monolithic crystal disk filter of FIG. 1.

FIG. 3 is a perspective, enlarged, exploded, front elevation view of a standard end mounted discrete crystal strip resonator, and which is mounted on a glass base and includes a tubular can.

FIG. 4 is a perspective, enlarged, rear perspective view of the discrete crystal strip resonator of FIG. 3.

FIG. 5 is a perspective, enlarged, exploded, front elevation view of an earlier attempt to manufacture an end mounted, monolithic crystal strip filter, and which is mounted on a glass base and includes a tubular can.

FIG. 6 is a perspective, enlarged, rear elevation view of the monolithic crystal strip filter of FIG. 5.

FIG. 9 is an enlarged, exploded, side sectional view of a first embodiment of the two-pole, monolithic crystal strip filter invention mounted on the prior art HC-49 low profile base and having a low profile can.

FIG. 10 is an enlarged, top plan view of the two-pole monolithic crystal strip filter of FIG. 9.

FIG. 11 is an enlarged top plan view of the two-pole monolithic crystal strip of FIG. 9 showing the placement of the signal electrodes, flags and mounting and ground contacts.

FIG. 12 is an enlarged bottom view of the two-pole, monolithic crystal filter of FIG. 9 showing the placement of the ground electrode, flags and mounting and ground contacts.

FIG. 15 is an enlarged exploded side sectional view of a second embodiment of the two-pole, monolithic crystal filter invention mounted on an HC-45 low profile base and having a low profile can.

FIG. 16 is a top view of the two-pole, monolithic crystal strip filter of FIG. 15.

FIG. 17 is a top view of the two-pole monolithic crystal strip filter of FIG. 15 showing the placement of the signal electrodes, flags and mounting and ground contacts.

FIG. 18 is a bottom view of the two-pole, monolithic crystal strip filter of FIG. 15 showing the placement of the ground electrode, flags and mounting and ground contacts.

FIG. 20 is an enlarged exploded perspective view of a first embodiment of the present four-pole monolithic crystal strip filter invention mounted on the HC-49 low profile base and having a low profile can.

FIG. 21 is a top view of the four-pole monolithic crystal strip filter of FIG. 20.

FIG. 22 is a top view of the four-pole monolithic crystal strip filter of FIG. 20 showing the placement of the signal electrodes, flags, ground shield and mounting and ground contacts.

FIG. 23 is a bottom view of the four-pole monolithic crystal strip filter of FIG. 20 showing the placement of the ground electrode, flags, ground shield and mounting and ground contacts.

FIG. 25 is an enlarged exploded side sectional view of a second embodiment of the present four-pole monolithic crystal filter invention mounted on the HC-45 low profile base and having a low profile can.

FIG. 26 is a top view of the four-pole monolithic crystal strip filter of FIG. 25.

FIG. 27 is a top view of the four-pole monolithic crystal strip filter of FIG. 25 showing the placement of the signal electrodes, flags, ground shield and mounting and ground contacts.

FIG. 28 is a bottom plan view of the four-pole monolithic crystal strip filter of FIG. 25 showing the placement of the ground electrode, flags, ground shield and mounting and ground contacts.

FIG. 29 is an enlarged side view of the present filter package invention showing the mounting and ground posts bent for surface mount application.

FIG. 30 is a bottom view of the filter package of FIG. 29.

FIG. 31 is a view of the filters connected in series.

DETAILED DESCRIPTION

Figure 19:
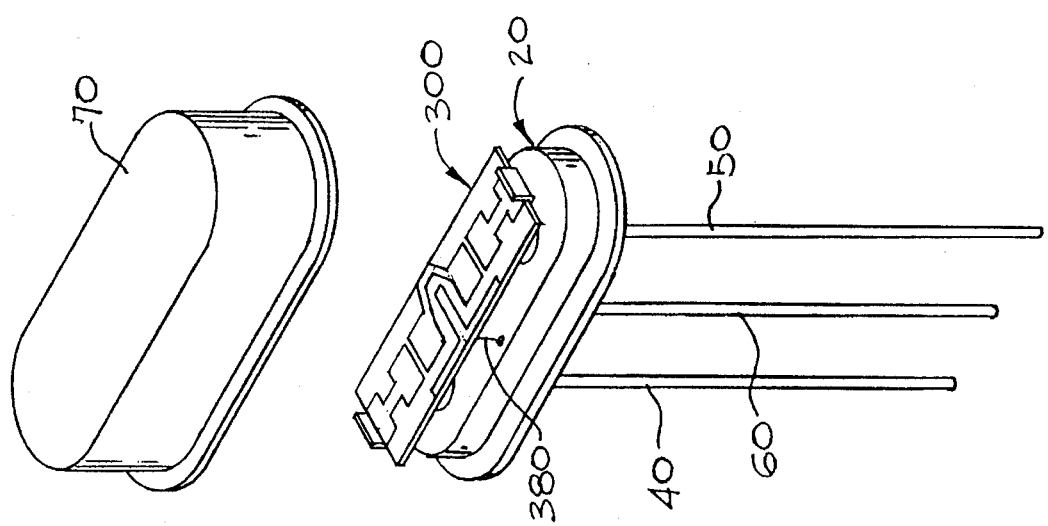
FIG. 19 is an enlarged exploded side sectional view of the present low profile, four-pole monolithic crystal strip filter package invention.
Figure 8:
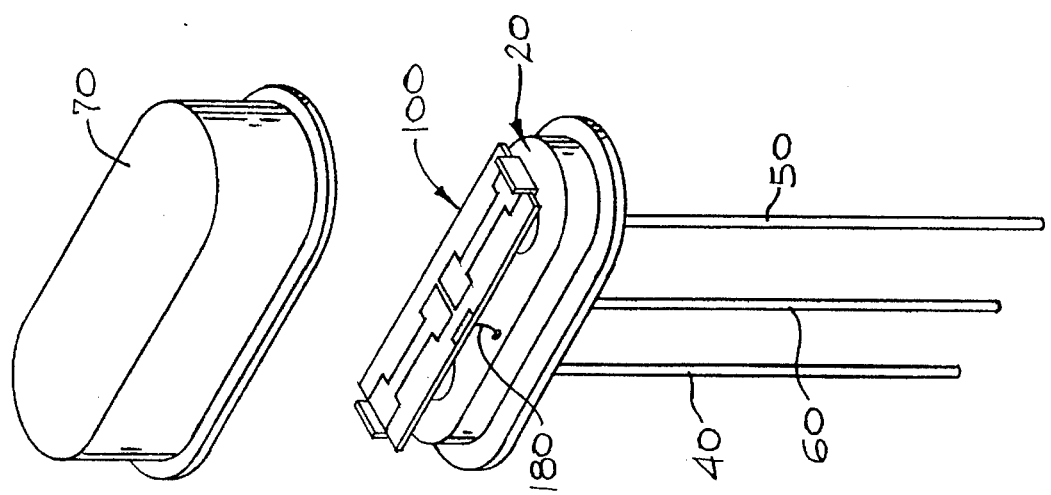
FIG. 8 is an enlarged exploded, plan view of the present low profile, two-pole monolithic crystal strip filter package invention.
Figure 7:
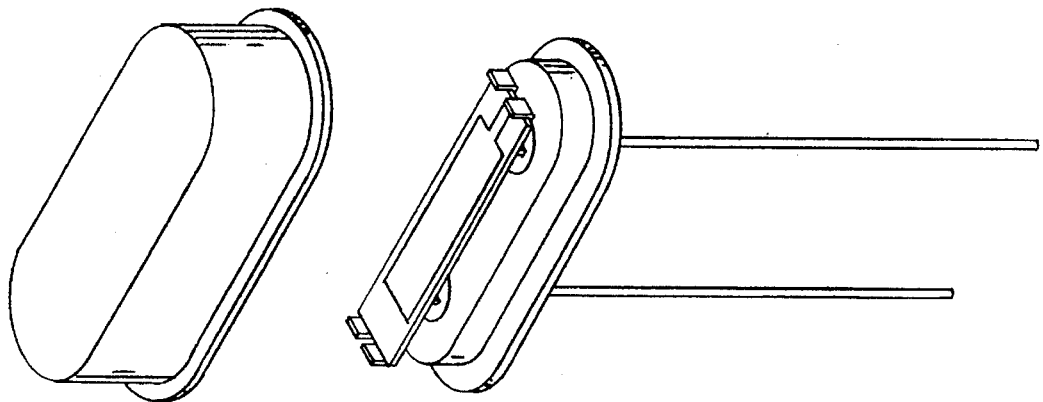
FIG. 7 is a perspective, enlarged, exploded, plan view of a standard, low profile discrete crystal strip resonator mounted on the HC-49 base and which employs a low profile can.

While this invention is susceptible of embodiments in many different forms, there is shown in the drawings and will herein after be described, several forms of the invention with the understanding that the present disclosure is to be considered as an exemplification of the principles of the invention, and is not intended to limit the broad aspects of the invention to the several embodiments illustrated.

Figure 13:
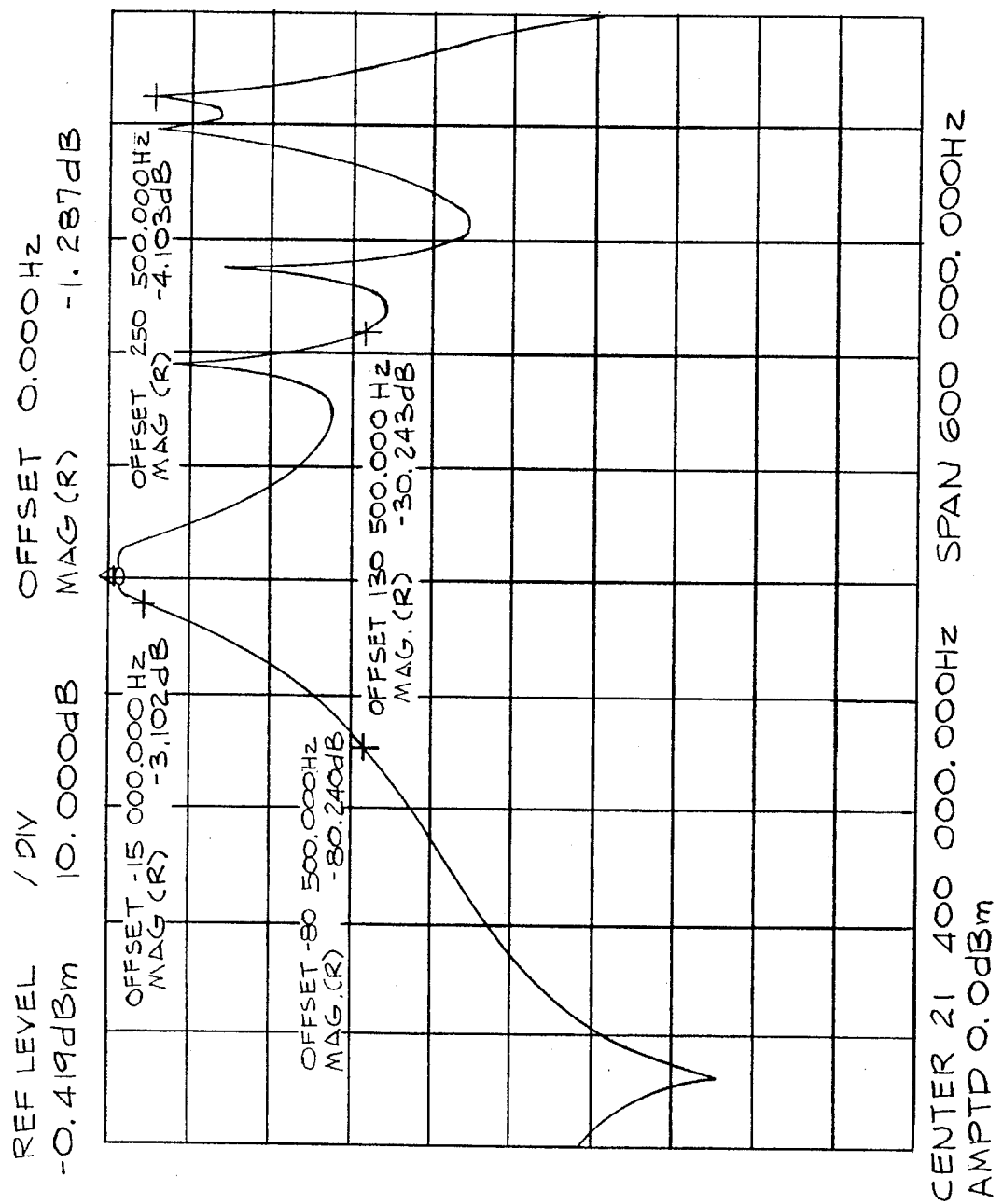
FIG. 13 is a graphical representation of a sample output signal for the two-pole filter of FIGS. 9–12.
Figure 14:
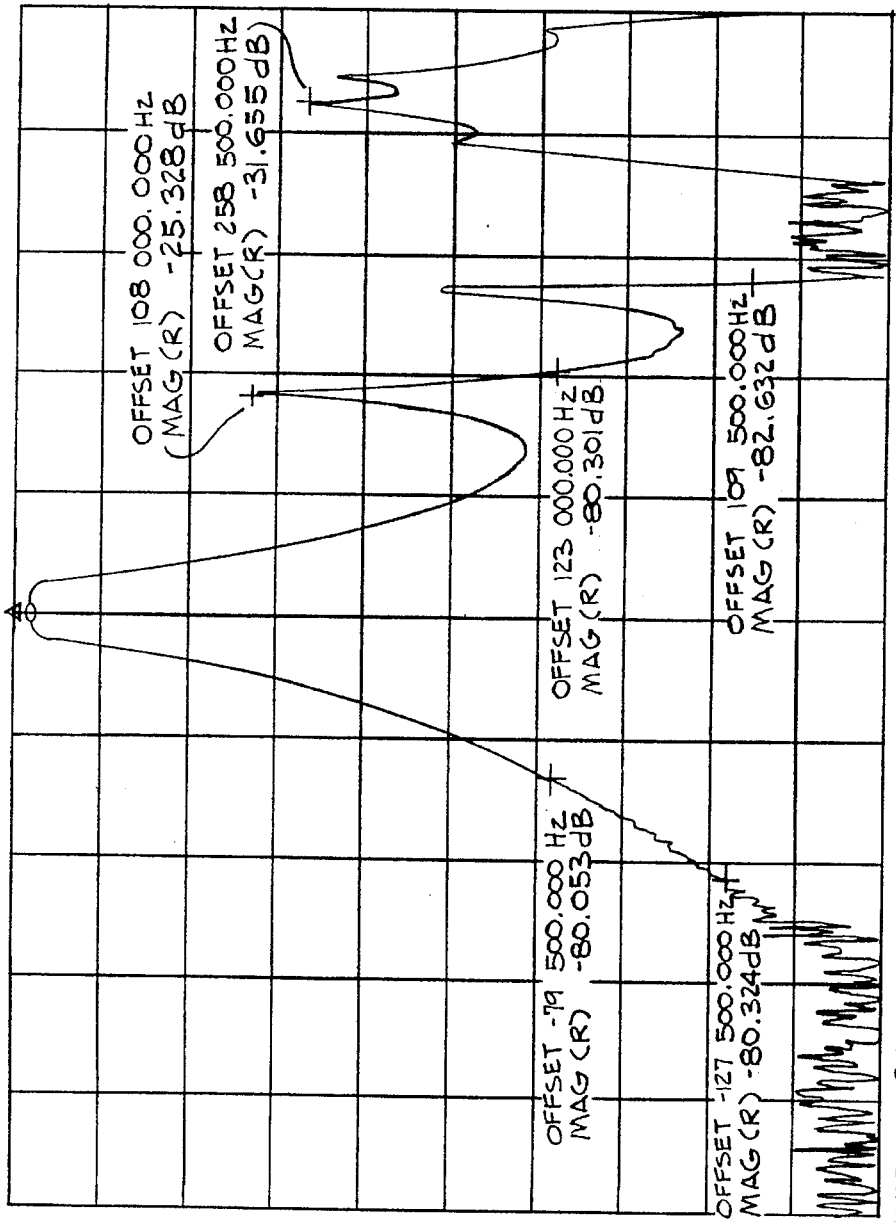
FIG. 14 is a plot of a sample output signal for two two-pole filters of FIGS. 9–12 connected in series.
Figure 24:
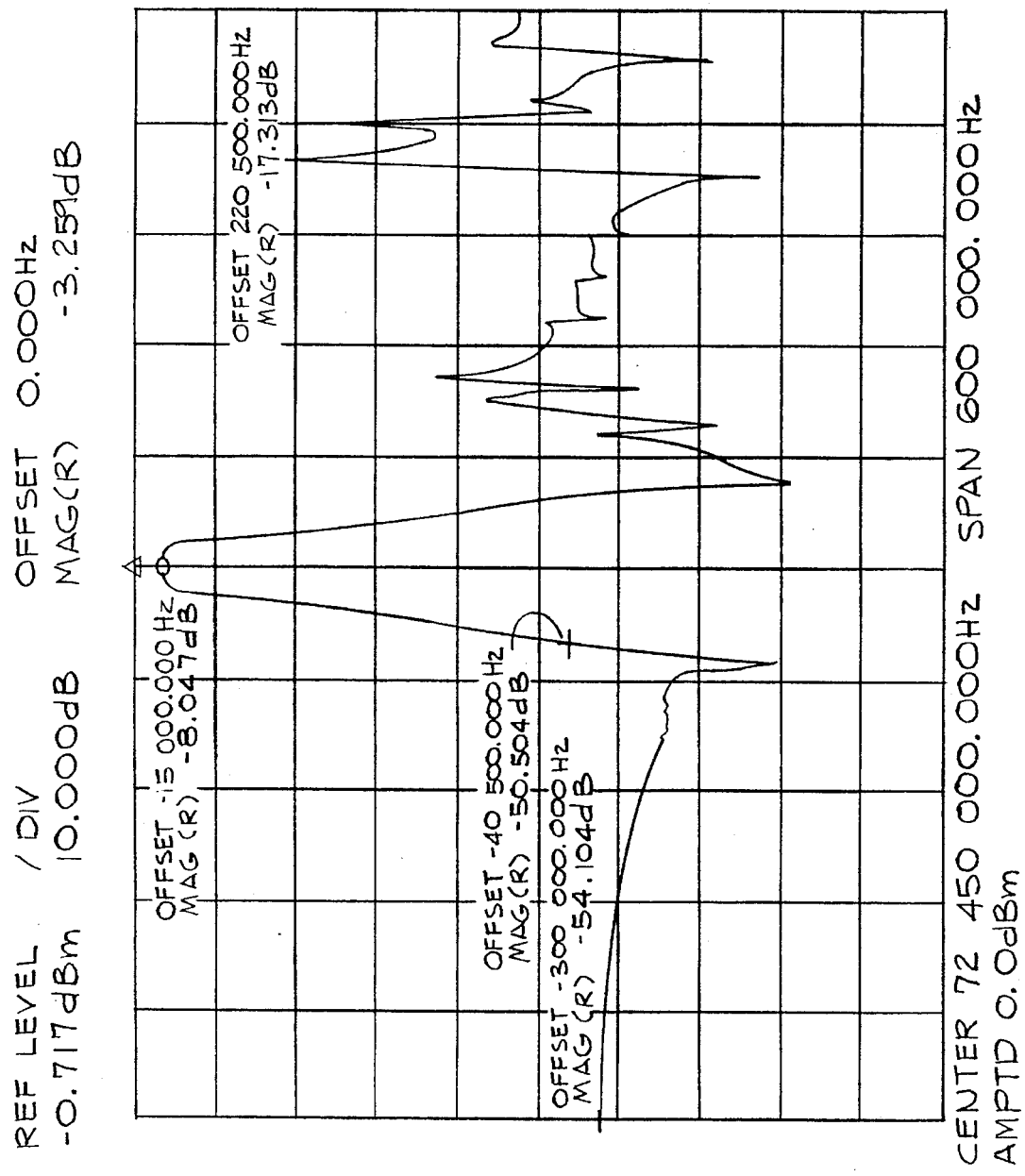
FIG. 24 is a geographical representation of a sample output signal for the four-pole filter of FIGS. 20–23.

The present invention relates to a low profile monolithic crystal strip filter package which is generally designated by the numeral 10; and a monolithic crystal strip filter which is generally designated by the numerals 100, 200, 300 and 500, respectively, and which may be mounted in the package 10. As should be understood, FIGS. 8–12 illustrate the two-pole strip filter 100 mounted on a standard HC-49 through-hole base; FIGS. 13 and 14 show plots of sample output signals responses produced by this two-pole filter; FIGS. 15–18 show the two-pole strip filter 200 mounted on a standard HC-45 through-hole base; FIGS. 19–23 show the four-pole strip filter 300 mounted on the HC-49 through-hole base; FIG. 24 shows a sample output signal response produced by this four-pole filter; and FIGS. 25–28 show the four-pole strip filter 500 mounted on the HC-45 base. Each of these forms of the invention is discussed in greater detail below.

As best seen in FIGS. 9 and 10, the filter package 10 includes a housing 15 formed by a base 20 and a low profile can 70. The base 20 includes a main body 21 that is relatively long in comparison to its width. The main body 21 has an upper surface 22 and a lower surface 23. The main body 21 also has first and second ends 24 and 25 and first and second sides 26 and 27 that define its perimeter 28. The base 20 includes a flange 30 that projects outwardly relative to the perimeter 28. The flange 29 is oriented in substantial flush relation with the lower surface 23 of base 20, and thereby creates a surface for matingly engaging the can 70 as will be discussed later. The base 20 is preferably manufactured from an electrically conductive and ferrous metal and is coated with a corrosion resistant nickel coating. This is similar to the standard, commercially available HC-45 or HC-49 base designs which are manufactured pursuant to United States Military Specification No. MIL-H-10056. It should be understood that individual filters 100 and 300 could be installed on a base equivalent to the HC-49 base, and that filters 200 and 500 could be installed on a base equivalent to the HC-45 base, an example of an equivalent HC-45 base is the UM-1 base.

The main body 21 of the base 20 contains a pair of openings located substantially midway between its sides 26 and 27. Each of the respective openings individually matingly receives an electrical insulator 31 or 32, such as the glass insulators as employed in the HC-45 or HC-49 base designs. Insulator 31 matingly receives an input mounting post 40, and insulator 32 matingly receives an output mounting post 50. A ground post 60 is welded to the lower surface 23 of base 20 at a location substantially midway between mounting posts 40 and 50. A lower portion 41 of input post 40 and a lower portion 51 of output post 50 are aligned in substantially parallel orientation to ground post 60. Posts 40, 50 and 60 project substantially perpendicularly outwardly from the lower surface 23 of base 20, and are electrically conductive and preferably made of kovar with a tin plating as in HC-45 and HC-49 base designs.

Each of the mounting posts 40 and 50 has an upper portion 42 or 52. The upper portions 42 and 52 are substantially flat and are bent or otherwise deformed in a predetermined step-like fashion. As best seen in FIG. 9, the upper portion 42 is bent toward the base end 24 so that its end 44 is located inside base end 24. Upper portion 52 is bent toward the base end 25 so that its end 54 is located inside the base end 25.

The low profile can 70 matingly interfits with the base 20 to form the hermeticly sealed housing 15 that contains the individual monolithic crystal strip filters 100, 200, 300 or 500. The can 70 has individual side walls 71–74 that define the inside of the can. The can 70 is closed at one end by an end wall 75, and is open at its opposite end 76. The open end 76 of can 70 is shaped to matingly engage or interfit with the upper surface of the flange 29 to form a hermetic seal which encloses the respective monolithic strip filter 100, 200, 300 or 500. Side walls 71–74 have a predetermined height dimension which prevents end wall 75 from physically contacting the individual monolithic strip filters 100, 200, 300 or 500 or post ends 44 and 54.

As earlier discussed, FIGS. 9–12 illustrate a first form of a low profile two-pole monolithic crystal strip filter 100 which contains a piezoelectric AT-cut quartz crystal strip 110. The crystal strip 110 is substantially rectangular in shape, and further has substantially parallel, upper or first surface 112 and lower or second surface 113. The crystal strip 110 has first and second ends 114 and 115, and first and second sides 116 and 117, that define an outer perimeter or periphery 118. Each end 114 and 115 of the strip 110 is mounted on the upper most step of each post 40 or 50. The strip 110 is further oriented or aligned in substantially parallel in relation to the upper surface 22 of the base 20. The strip 110 is substantially centered or positioned over the upper surface 22 of the base 20, and the perimeter 118 of the strip is located within the perimeter 28 of the surface 22 such that the edges 114–117 of the strip do not physically engage the individual side walls 71–74 of the can 70. In this form of the invention, the length dimension of the strip 110 is roughly three times greater than its width dimension. The crystal strip 110 preferably has a length dimension of about 0.320 inches and a width dimension of about 0.102 inches to facilitate installation of the filter on the associated HC-49 base.

As best seen in FIGS. 11 and 12, the crystal strip 110 has a center line 120 which extends from one end 114 of the strip to the other 115. The center line 120 is located approximately midway between the sides 116 and 117 of the crystal strip, and thereby divides the crystal strip 110 into substantially equal halves. The crystal strip 110 also includes a dividing line, or line of symmetry 130 which extends from one side 116 of the strip to the other 117. The line of symmetry 130 is located approximately midway between the individual ends 114 and 115, and thereby divides the crystal strip 110 into two substantially equal portions 131 and 132.

The monolithic filter 110 includes one set of input and output or signal electrodes 141 and 151 and which are individually formed on the upper surface 112 of the crystal strip 110. This is best illustrated by reference to FIG. 11. The individual input and output electrodes 141 and 151 are substantially the same size and shape, and further have respective length and width dimensions of about 0.050 inches each. Each of the electrodes 141 and 151 is oriented in a predetermined location on center line 120 and located a given distance of about 0.002 inches from the line of symmetry 130. Electrode 141 is electrically connected to a mounting contact 142 located on one end 114 of the strip by a flag 145. Electrode 151 is electrically connected to a mounting contact 152 located on the other end 115 of the strip by a flag 155.

Mounting contact 142 has a portion 143 formed on the upper surface 112 of the strip and a portion 144 formed on the lower surface 113. Similarly, mounting contact 152 has a portion 153 formed on the upper surface 112 of the strip and a portion 154 formed on lower surface 113. The lower portions 143 and 153 are aligned in substantial registry with their respective upper portions 144 or 154. Each of the upper mounting contact portions 143 or 153 is electrically coupled to its respective lower mounting contact portion 144 or 154 by electrically conductive cement applied when securing the filter 100 to the mounting posts 40 and 50. Each of the respective mounting contact portions 143, 144, 153 and 154 is substantially the same size and shape, and further has a given length of about 0.040 inches and width of about 0.050 inches. The individual mounting contacts 142 and 152, are substantially symmetrically oriented about center line 120, and are further located at locations proximal the strip ends 114 or 115, respectively. Mounting contacts 142 and 152 have a width substantially the same as electrodes 141 and 151. The individual flags 145 and 155 are substantially the same size and shape, with a given length dimension of about 0.068 inches and a given width dimension of about 0.015 inches.

A pair of ground electrodes 161 and 171 are formed on the lower surface 113 of the crystal strip 110, as shown in FIG. 12. Each of the ground electrodes 161 and 171 is electrically coupled to a ground contact 165 by means of a ground flag 162 or 172. The ground electrodes 161 and 171 are substantially the same size and shape and are aligned in substantial registry with the input and output electrodes 141 and 151, respectively. Each of the ground electrodes 161 or 171 also includes a symmetry flag 163 or 173, respectively. The individual symmetry flags 163 and 173 are substantially the same size and shape and are aligned in substantial registry with the individual flags 145 or 155, respectively. The symmetry flags 163 and 173 are shorter than the individual flags 145 and 155 and do not physically contact the lower portions 144 and 154 of the individual mounting contacts 142 and 152. The ground electrodes 161 and 171 and the symmetry flags 163 and 173 are positioned substantially symmetrically about center line 120. The ground electrodes 161 and 171; the flags 162 and 172; and the symmetry flags 163 and 173 are also located substantially symmetrically about line 130. Although the ground electrodes 161 and 171 have been shown and described as being two separate electrodes, it should be understood that they could be joined to form a single ground electrode which is oriented in substantially registry with both the input and output electrodes 141 and 151.

Ground contact 165 has a portion 166 formed on upper surface 112 of the strip and a portion 167 formed on lower surface 113. Lower portions 167 is aligned in substantial registry with upper portions 166. Upper ground contact portion 166 is electrically connected to its lower ground contact portion 167 by electrically conductive cement applied when securing the ground member which is preferably a wire 180 to the filter 100. Ground contact 165 is substantially centered about line of symmetry 130 and is located proximal strip side 116.

The individual electrodes 141, 151, 161 and 171; contacts 142, 152 and 165, and the individual flags 145, 155, 162, 163, 172 and 173 are conductive elements which are arranged in a predetermined configuration on the surfaces 112 and 113 of the crystal strip 110 to produce a commercially viable two-pole filter. The specific configuration of the plated elements can be defined by designating side 116 or center line 120 as a x-axis and end 114 as a y-axis, and describing the position of each element in relation to these axes. The x-axis extends from one end 115 of the strip to the other or from 0.0 to 1.0. Similarly, the y-axis extends from one side 116 of the strip to the other 117 or from 0.0 to 1.0. As should be understood, the individual elements are arranged on the upper and lower surfaces 112 and 113 of the crystal strip 110 in roughly the following configurations:

| Configuration of Two-Pole Strip Filter 100 | | |
|---|---|---|
| PLATED ELEMENT | X-AXIS | Y-AXIS |
| Upper Surface 112 | | |
| Mounting Contact 143 | 0.00 to 0.13 | 0.25 to 0.75 |
| Electrode Flag 145 | 0.13 to 0.34 | 0.43 to 0.57 |
| Electrode 141 | 0.34 to 0.49 | 0.25 to 0.75 |
| Electrode 151 | 0.51 to 0.66 | 0.25 to 0.75 |
| Electrode Flag 155 | 0.66 to 0.87 | 0.43 to 0.57 |
| Mounting Contact 153 | 0.87 to 1.00 | 0.25 to 0.75 |
| Ground Contact 166 | 0.40 to 0.60 | 0.00 to 0.06 |
| Lower Surface 113 | | |
| Mounting Contact 144 | 0.00 to 0.13 | 0.25 to 0.75 |
| Symmetry Flag 163 | 0.19 to 0.34 | 0.43 to 0.57 |
| Ground Electrode 161 | 0.34 to 0.49 | 0.25 to 0.75 |
| Ground Electrode 171 | 0.51 to 0.66 | 0.25 to 0.75 |
| Symmetry Flag 173 | 0.66 to 0.81 | 0.43 to 0.57 |
| Mounting Contact 154 | 0.87 to 1.00 | 0.25 to 0.75 |
| Ground Contact 167 | 0.42 to 0.58 | 0.00 to 0.06 |
| Ground Flag 162 | 0.42 to 0.45 | 0.06 to 0.25 |
| Ground Flag 172 | 0.55 to 0.58 | 0.06 to 0.25 |

FIG. 13 illustrated a graphical depiction of a sample output signal produced by crystal filter 100 when the above elements are plated onto the crystal strip 110 in the above configuration and to the approximate dimensions shown in FIGS. 11 and 12. To achieve a center frequency of about 21.4 MHz, strip 110 should have a thickness of about 0.003000 inches and the plated elements should have a thickness of about 0.000028037 inches on each side of the strip. Other center frequencies between the range of about 4 to 500 MHz should be obtainable by varying the thickness of the strip and plated elements. Other bandwidths between the range of 3 to 250 kHz should be obtainable by varying the electrode separation, length of the electrodes and thickness of the strip and plated elements.

The depiction shown in FIG. 13 is for a constant 0.419 dBm input signal through a frequency span of 600 kHz. The crystal filter 100 produces a 3 dB bandwidth of about 30 kHz, a 15 dB bandwidth of about 80 kHz and a potential 30 dB bandwidth of about 200 kHz. The crystal filter 100, has an insertion loss of about 1.2 dB. For the sample filter graphically depicted in FIG. 13, the spurious responses occur at high side frequency offsets of about 110 kHz to a level of about 6 dB; 170 kHz to a level of about 12 dB; and 250 kHz to a level of about 4 dB. The filter 100 has a low side ultimate attenuation of about 55 dB and a high side ultimate of about 55 dB. It should be understood that the output signal will vary somewhat for each filter made to the above configuration and dimensions due to manufacturing tolerances.

FIG. 14 shows a plot of a sample output signal produced by two filter packages 10 placed in series, each package containing one filter 100. The plot is for a constant 0.429 dBm input signal through a frequency span of 600 kHz. The two combined filters 100 produce an output signal with a 3 dB bandwidth of about 30 kHz; a 15 dB waveband of about 50 kHz; and a 30 dB bandwidth of about 70 kHz; and a potential 60 dB bandwidth of about 160 kHz. The two crystal filters 100, which are electrically coupled in series, have a combined insertion loss of about 1.8 dB. Spurious responses occur at frequency offsets of about approximately 108 kHz to a level of about 25 dB; 160 kHz to a level of approximately 45 dB; and 250 kHz to a level of approximately 31 dB. These spurious responses are believed to be commercially acceptable for a wide range of applications. The filter 100 has a low side ultimate of about 90 dB and a high side ultimate of about 90 dB.

FIGS. 15–18 illustrate a second form of the low profile two-pole monolithic crystal strip filter 200. This form of invention includes a piezoelectric AT-cut quartz crystal strip 210. The crystal strip 210 is substantially rectangular in shape and has substantially parallel, upper or first surface 212 and lower or second surface 213. The crystal strip 210 has first and second ends 214 and 215, and further has first and second sides 216 and 217, respectfully, that define an outer perpendicular perimeter 118. Each end 214 and 215 of the strip 210 is mounted on the upper most step of its respective post 40 or 50. The crystal strip 210 is aligned or otherwise oriented in substantially parallel relative relation to the surface 22 of the base 20. The crystal strip 210 is substantially centered or otherwise oriented in a predetermined position on the surface 22 of base 20. The perimeter 218 of the strip is within the perimeter 28 of surface 22 such that the edges 214–217 of the strip do not physically engage the individual side walls 71–74 of the can 70. In this form of the invention, the length dimension of the strip 210 is roughly four times greater than its width dimension. The crystal strip 210 preferably has a length dimension of about 0.229 inches and a width dimension of about 0.052 inches to facilitate mounting on the HC-45 base.

The crystal strip 210 has a center line which is designated by the numeral 220 which extends from one end 214 of the crystal strip to the opposite end 215. The center line 220 is located about midway between the sides 216 and 217 of the crystal strip and divides the crystal strip 210 into substantially equal halves. The crystal strip 210 also includes a dividing line or line of symmetry which is distinguished by the numeral 230 and which extends from one side 216 of the strip to the other side 217. The line of symmetry 230 is located approximately midway between the respective ends 214 and 215, and divides the strip 210 into two substantially equal portions 231 and 232, respectively.

The monolithic filter 110 includes one set of input and output or signal electrodes 241 and 251, respectively, which are formed on the upper surface 212 of the crystal strip 210. This is best seen by reference to FIG. 17. The input and output electrodes 241 and 251 are substantially the same size and shape, and have a length dimension of about 0.020 inches, and a width dimension of about 0.027 inches. Each of the electrodes 241 and 251 is oriented substantially symmetrically about the center line 220 and further located a given distance of about 0.002 inches from the line of symmetry 230. Electrode 241 is electrically coupled to a mounting contact 242 by an electrode flag 245. Electrode 25 is electrically connected to a mounting contact 25 by a similar electrode flag 255.

Mounting contact 242 has a portion 243 formed on upper surface 212 of the strip and a portion 244 formed on lower surface 213. Mounting contact 252 has a portion 253 formed on upper surface 212 of the strip and a portion 254 formed on the lower surface 213. The individual lower portions 243 and 253 are aligned in substantial registry with the corresponding upper portions 244 and 254, respectively. Each of the respective upper mounting contact portions 243 or 253 is electrically coupled with its corresponding lower mounting contact portion 244 or 254 by electrically conductive cement. Each of the respective mounting contact portions 243, 244, 253 and 254 is substantially the same size and shape, and further has a length dimension of about 0.033 inches and a width dimension of about 0.027 inches. The mounting contacts 242 and 252 are oriented in predetermined location about the center line 220 and are located proximal strip ends 214 or 215, respectively. The mounting contacts 242 and 252 have a width substantially the same as electrodes 241 and 251. The flags 245 and 255 have substantially the same size and shape, and further have a length dimension of about 0.060 inches and a width dimension of about 0.015 inches.

A pair of ground electrodes 261 and 271 are formed on the lower surface 213 of crystal strip 210 as shown in FIG. 18. Each of the ground electrodes 261 and 271 is electrically connected to a corresponding ground contact 265 by means of a ground flag 262 or 272. The ground electrodes 261 and 271 are substantially the same size and shape and aligned in spaced, substantially parallel registry with the input and output electrodes 241 and 251, respectively. Each of the ground electrodes 261 or 271 includes a symmetry flag which is identified by the numerals 263 or 273, respectfully. The individual symmetry flags 263 and 273 are substantially the same size and shape as the respective input and output electrode flags 245 and 255 and are further aligned in substantial registry with the individual input and output electrode flags 245 or 255, respectively. The symmetry flags 263 and 273 are shorter in relative comparison than the input and output electrode flags 245 and 255 and do not contact the lower portions 244 and 254 of the individual mounting contacts 242 or 252. The ground electrodes 261 and 271 and their respective symmetry flags 263 and 273 are positioned in a substantial symmetrically orientation about the center line 220. The ground electrodes 261 and 271; ground flags 262 and 272 and symmetry flags 263 and 273 are also located in a substantial symmetrical orientation about the line of symmetry 230. Although the ground electrodes 261 and 271 have been shown and described as being two separate electrodes, it should be understood that they could be joined in a fashion to form a single ground electrode which is disposed in substantial registry with both the input and output electrodes 241 and 251.

Ground contact 265 has a portion 266 formed on upper surface 212 of the strip and a portion 267 formed on lower surface 213. Lower portions 267 is aligned in substantial registry with upper portions 266. Upper ground contact portion 266 is electrically connected to its lower ground contact portion 267 by electrically conductive cement applied when securing the ground member which is preferably a wire 280 to the filter 200. Ground contact 265 is substantially centered on line of symmetry 230 and is located proximal strip side 216.

The individual electrodes 241, 251, 261 and 271; the respective contacts 242, 252 and 265, and the individual flags 245, 255, 262, 263, 272 and 273 form a series of elements which are arranged in a predetermined configuration or pattern on the individual surfaces, 212 and 213 of the crystal strip. These patterns or configurations produce a commercially viable two-pole crystal filter having a minimum amount of spurious responses and insertion losses. The elements are arranged on the upper and lower surfaces 112 and 113 of the crystal strip 110 in roughly the following configurations:

| Configuration of Two-Pole Strip Filter 200 | | |
| --- | --- | --- |
| ELEMENT | X-AXIS | Y-AXIS |
| Upper Surface 212 | | |
| Mounting Contact 243 | 0.00 to 0.14 | 0.24 to 0.76 |
| Electrode Flag 245 | 0.14 to 0.40 | 0.36 to 0.64 |
| Electrode 241 | 0.40 to 0.49 | 0.24 to 0.76 |
| Electrode 251 | 0.51 to 0.60 | 0.24 to 0.76 |
| Electrode Flag 255 | 0.60 to 0.86 | 0.36 to 0.64 |

-continued

Configuration of Two-Pole Strip Filter 200

| ELEMENT | X-AXIS | Y-AXIS |
| --- | --- | --- |
| Mounting Contact 253 | 0.86 to 0.10 | 0.24 to 0.76 |
| Ground Contact 266 | 0.45 to 0.55 | 0.00 to 0.12 |
| Lower Surface 213 | | |
| Mounting Contact 244 | 0.00 to 0.14 | 0.24 to 0.76 |
| Symmetry Flag 263 | 0.23 to 0.40 | 0.36 to 0.64 |
| Ground Electrode 261 | 0.40 to 0.49 | 0.24 to 0.76 |
| Ground Electrode 271 | 0.51 to 0.60 | 0.24 to 0.76 |
| Symmetry Flag 273 | 0.60 to 0.77 | 0.36 to 0.64 |
| Mounting Contact 254 | 0.86 to 0.10 | 0.24 to 0.76 |
| Ground Contact 267 | 0.45 to 0.55 | 0.00 to 0.12 |
| Ground Flag 262 | 0.45 to 0.48 | 0.12 to 0.24 |
| Ground Flag 272 | 0.52 to 0.55 | 0.12 to 0.24 |

To achieve a center frequency of about 21.4 MHz, strip should have a thickness of about 0.003000 inches and the plated elements should have a thickness of about 0.000028037 inches on each side of the strip. Crystal filter 200 achieves an output signal performance similar to that which was earlier discussed with respect to crystal filter 100. Again, different center frequencies and bandwidths should be obtainable between the ranges of 4 to 500 MHz and 3 to 250 kHz, respectively, by varying the thickness of the strip and plated elements, and the separation between and length of the electrodes.

FIGS. 19–23 illustrate a third form of the invention that as a low profile four-Dole monolithic crystal strip filter 300. The crystal strip filter includes a piezoelectric AT-cut quartz crystal strip 310. The crystal strip 310 is substantially rectangular in shape with substantially parallel upper or first surface 312 and lower or second surface 313. Crystal strip 310 has first and second ends 314 and 315, and first and second sides 316 and 317, that define an outer perimeter 318. Each end 314 and 315 of crystal strip 310 is mounted on the upper most step of its respective post 40 or 50. The crystal strip 310 is oriented or otherwise aligned substantially parallel to the surface 22 of base 20. The crystal strip 310 is substantially centered or otherwise oriented in a predetermined location on the surface 22 of base 20 so that the perimeter 218 of the strip is located within the perimeter 28 of the base 20, and the edges 314–317 of the crystal strip do not physically engage any of the side walls 71–74 of the can 70. The length dimension of the crystal strip 310 is roughly three times greater than its width dimension. The crystal strip 310 preferably has a length dimension of about 0.320 inches and a width dimension of about 0.102 inches. These physical dimensions facilitate the mounting on the HC-49 base.

The crystal strip 310 has a center line 320 which extends from one end 314 of the crystal strip to the opposite end 315. The center line 320 is located about midway between the sides 316 and 317 of the crystal strip and divides the strip 310 into substantially equal halves. The crystal strip 310 also includes a dividing line or line of symmetry 330 which extends from one side 316 of the crystal strip to the opposite side 317. The line of symmetry 330 is located about midway between the individual ends 314 and 315, respectively, and thereby divides the crystal strip 310 into two substantially equal portions 331 and 332.

The four-pole monolithic filter 300 includes two sets of signal electrodes 340 and 360. The first set of electrodes 340 includes an input electrode 341 an output electrode 351 and a ground electrode 381. The second set of electrodes 360 includes an input electrode 361 output electrode 371 and a ground electrode 391. As best shown in FIG. 22, the input and output electrodes 341, 351, 361 and 371 are formed or otherwise borne by the upper surface 312 of the crystal strip 310. These electrodes are of substantially the same size and shape, and are oriented in predetermined locations about the center line 320. Each of the individual electrodes 341, 351, 361 and 371 has a length dimension of about 0.033 inches, and a width dimension of about 0.043 inches. The individual electrodes 341 and 351 are spaced about 0.004 inches apart. Electrodes 361 and 371 are also spaced the same distance apart. The first and second sets of electrodes 340 and 350 are located in a predetermined symmetrical pattern about line of symmetry 330. The output and input electrodes 351 and 361 are electrically joined or coupled by a connection flag 352 which has a given width dimension of about 0.015 inches. The connecting flag 352 has a first portion 353 which extends at about a 45° angle relative to the side 317 of crystal strip 310; a second portion 354 which extends in an orientation which is substantially parallel to, and along side 317; and a third portion 355 which extends at a 45° angle relative to the input electrode 361. The input and output electrodes 341 and 371 are electrically connected or coupled to a mounting contact 342 or 352 by flags 345 or 375, respectively.

The mounting contact 342 has a portion 343 formed on upper surface 312 and a portion 344 formed on lower surface 313. The mounting contact 372 has a portion 373 formed on upper surface 312; and a portion 374 formed on lower surface 313. The lower portions 343 and 373 are aligned in substantial registry with upper portions 344 and 374, respectively. The upper portions 343 or 373 of each of the mounting contacts is electrically connected or coupled to its respective lower portion 344 or 374 by electrically conductive cement. Further, each of the mounting contact portions 343, 344, 373 and 374 is substantially the same size and shape, and further has a length dimension of about 0.025 inches and a width dimension of about 0.043 inches. The mounting contacts 342 and 372 are oriented in a pattern about the center line 320 and otherwise positioned at their respective ends 314 or 315 of crystal strip 310. The mounting contacts 342 and 272 have a width substantially the same as electrodes 341 and 371. The flags 345 and 375 are substantially the same size and shape, and further have with a length dimension of about 0.068 inches, and a width dimension of about 0.015 inches. Each of the flags 345 and 375 extends from its respective electrode 341 or 371 to its respective mounting contact 342 or 372.

Ground electrodes 381 and 391 are formed or otherwise borne on the lower surface 313 of crystal strip 310. This is best shown by reference to FIG. 23. Each of the ground electrodes 381 and 391 is electrically connected or coupled to a ground contact 400 by means of a ground flag 382 or 392, respectively. The ground electrodes 381 and 391 have substantially the same size and shape. Further, each of the ground electrodes 381 and 391 is also substantially aligned and otherwise disposed in registry with its corresponding set of input and output electrodes 340 and 360. Each of the ground electrodes 381 or 391 includes a symmetry flag 383 or 393. The individual symmetry flags 383 and 393 have sizes and shapes that are substantially equivalent to their respective input and output electrode flags 345 and 375. The symmetry flags are aligned or otherwise disposed in substantial registry with the respective input and output electrode flags. The symmetry flags 383 and 393 are shorter, in relative comparison to the input and output electrode flags 345 and 375 and do not physically contact the lower portion 344 and 354 of mounting contacts 342 or 352, respectively.

The ground electrodes 381 and 391 and their respective symmetry flags 383 and 393 are oriented or otherwise positioned in a symmetrical pattern about the center line 320. The ground electrodes 381 and 391; the ground flags 382 and 392; and the pattern symmetry flags 383 and 393 are also located in a symmetrical pattern about the line of symmetry 330. Although each of the ground electrodes 381 and 391 has been shown and described as being an integral electrode which is positioned in substantial registry relative to both of its respective input and output electrodes 341 and 351 or 361 and 371; it should be understood that each of the ground electrodes 381 or 391 could be split to form four separate ground electrodes. In this regard, each of the ground electrodes would be positioned in substantial registry with one input or output electrode.

The ground contact 400 includes an upper portion 401 formed on or otherwise borne by the upper surface 312 of the crystal strip; and a lower portion 402 formed on or borne by the lower surface 313 of the crystal strip. Lower portions 402 is aligned in substantial registry with upper portions 401. Upper portion 401 is electrically connected to lower portion 402 by electrically conductive cement applied when securing the ground member which is preferably a wire 420 to the filter 300 as discussed below. Ground contact 400 is substantially centered on line of symmetry 330 and is located proximal strip side 316.

A ground shield 410 extends from ground contact 400 and is oriented along the line of symmetry 330. The ground shield 410 includes an upper portion 412 which is formed on the upper surface 312 of the crystal strip, and a lower portion 413 which is formed on the lower surface 313 of the strip and which further is disposed in substantial registry with the corresponding upper portion 412. Ground shield 410 is substantially centered on line of symmetry 330 and is located proximal strip side 316.

The monolithic filter 300 includes crystal strip 310 and plated elements designated by the numerals 340–413, respectively. These elements are arranged in a predetermined configuration or pattern on the surfaces 312 and 313 of the crystal strip 310 to produce a four-pole filter having a minimum amount of spurious responses and insertion losses. The elements borne by the upper and lower surfaces 312 and 313 of the crystal strip 310 are arranged in roughly the following configurations:

| Configuration of Four-Pole Strip Filter 300 | | |
| --- | --- | --- |
| ELEMENT | X-AXIS | Y-AXIS |
| Upper Surface 312 | | |
| Mounting Contact 343 | 0.00 to 0.80 | 0.29 to 0.71 |
| Electrode Flag 345 | 0.80 to 0.16 | 0.43 to 0.57 |
| Electrode 341 | 0.16 to 0.26 | 0.29 to 0.71 |
| Electrode 351 | 0.27 to 0.38 | 0.29 to 0.71 |
| Connector Flag 352 | | |
| Angled portion 353 | 0.38 to 0.44 | 0.71 to 0.80 |
| Linear strip 354 | 0.44 to 0.56 | 0.80 to 0.10 |
| Angled portion 355 | 0.56 to 0.62 | 0.71 to 0.80 |
| Electrode 361 | 0.62 to 0.73 | 0.29 to 0.71 |
| Electrode 371 | 0.74 to 0.84 | 0.29 to 0.71 |
| Electrode Flag 375 | 0.84 to 0.92 | 0.43 to 0.57 |
| Mounting Contact 373 | 0.92 to 0.10 | 0.29 to 0.71 |
| Ground Contact 401 | 0.25 to 0.75 | 0.00 to 0.60 |
| Ground Shield 412 | 0.48 to 0.52 | 0.60 to 0.71 |
| Lower Surface 313 | | |
| Mounting Contact 344 | 0.00 to 0.80 | 0.29 to 0.71 |
| Symmetry Flag 383 | 0.13 to 0.16 | 0.43 to 0.57 |
| Ground Electrode 381 | 0.16 to 0.38 | 0.29 to 0.71 |
| Ground Electrode 391 | 0.62 to 0.84 | 0.29 to 0.71 |
| Symmetry Flag 393 | 0.84 to 0.87 | 0.43 to 0.57 |
| Mounting Contact 374 | 0.92 to 0.10 | 0.29 to 0.71 |
| Ground Contact 402 | 0.25 to 0.75 | 0.00 to 0.60 |
| Ground Flag 382 | 0.25 to 0.28 | 0.60 to 0.29 |
| Ground Flag 392 | 0.72 to 0.75 | 0.60 to 0.29 |
| Ground Shield 413 | 0.48 to 0.52 | 0.60 to 0.71 |

FIG. 24 graphically illustrates a plot of a sample output signal produced by the crystal filter 300 when the above elements are plated or otherwise applied to the crystal strip 110 in the above configuration or orientations and to the relative dimensions as shown in FIGS. 22 and 23. To achieve a center frequency of about 72.45 MHz, the strip 310 is about 0.002691 inches thick and the plated elements are about 0.000009705 inches thick on each side of the strip. Other center frequencies between the range of 4 to 500 MHz and bandwidths between the range of 3 to 250 kHz should be obtainable by varying the thickness of the strip and plated elements, and the separation between and length of the electrodes.

The graphical depiction is for a constant 0.717 dBm input signal. Filter 300 produces a 6 dB bandwidth of about 30 kHz, a 30 dB bandwidth of about 54 kHz, and a 45 dB bandwidth of about 73 kHz. The crystal filter 100 has an insertion lose of about 3.26 dB. Again, it should be understood that the output signal will vary somewhat for each crystal filter produced to the above teachings due to manufacturing tolerances. For the particular crystal filter 300 shown in FIGS. 22 and 23, spurious responses occur at frequency offsets of about 70 kHz to a level of about 55 dB; about 90 kHz to a level of about 40 dB; about 110 KHz to a level of about 35 dB; and about 220 KHz to a level of 17 dB. The filter 300 has low and high side ultimate attenuations of about 65 dB.

FIGS. 25–28 shows a fourth form of a low profile four-pole monolithic crystal strip filter 500. The crystal strip filter includes a piezoelectric AT-cut quartz crystal strip 510. The crystal strip 510 is substantially rectangular in shape, and has substantially parallel, upper or first surface 512 and lower or second surface 513. The crystal strip 510 has first and second ends 514 and 515, and first and second sides 516 and 517, define an outer peripheral edge or perimeter 518. Each of the ends 514 and 515 of strip 510 is mounted on the upper most step of its respective post 40 or 50. The crystal strip 510 is aligned or oriented in substantially parallel relation relative to the surface 22 of base 20. The crystal strip 510 is positioned in a predetermined location relative to the surface 22 of base 20 so that the perimeter 518 of the strip is located within the perimeter 28 of the base 20, and the edges 514–517 of the strip do not physically engage the individual side walls 71–74 of can 70. The length dimension of the crystal strip 510 is approximately four times greater than its width dimension. The crystal strip 510 preferably has a length dimension of about 0.229 inches, and a width of about 0.052 inches to facilitate mounting of the crystal filter on the HC-45 base.

The crystal strip 510 has a center line 520 which extends from one end 514 of the crystal strip to the opposite end 515. The center line 520 is located about midway between the sides 516 and 517 of the crystal strip and divides the crystal strip 510 into substantially equal halves. The crystal strip 510 also includes a dividing line or line of symmetry 530 which extends from one side 516 of the crystal strip to the opposite side 517. The line of symmetry 530 is located about midway between the individual ends 514 and 515, and thereby divides the crystal strip 510 into two substantially equal portions 531 and 532.

The four-pole monolithic filter 500 includes two sets of signal electrodes 540 and 560, respectively. The first set of electrodes 540 includes an input electrode 541 an output electrode 551 and a ground electrode 581. The second set of electrodes 560 includes an input electrode 561 an output electrode 571 and a ground electrode 591. As shown FIG. 27, the input and output electrodes 541, 551, 561 and 571 are formed on or otherwise borne by the upper surface 512 of crystal strip 510. These elements are of substantially the same size and shape, and additionally are oriented in a predetermined pattern about the center line 520. Each of the electrodes 541, 551, 561 and 571 has a length dimension of about 0.020 inches and a width dimension of about 0.027 inches. The electrodes 541 and 551 are spaced 0.008 inches apart, as are electrodes 561 and 571. The first and second sets of electrodes 540 and 550 are located in a symmetrical pattern about the line of symmetry 530. The output and input electrodes 551 and 561 are electrically joined or coupled by a connection flag 552 which has a width dimension of about 0.010 inches. The connection flag 552 has a first portion 553 which extends at about a 45° angle relative to the side 517 of crystal strip 510; a second portion 554 which extends substantially parallel orientation relative to, and along the side 517; and a third portion 555 which extends at a 45° angle relative to the input electrode 461. The input and output electrodes 541 and 571 are electrically connected or complied to a mounting contact 542 or 552 by means of a flag 545 or 575, respectively.

The mounting contact 542 has a portion 543 formed on upper surface 512 and a portion 544 formed on lower surface 513. The mounting contact 542 has a portion 543 formed on upper surface 512 and a portion 544 formed on lower surface 513. The lower portions 543 and 573 are aligned or otherwise disposed in substantial registry with upper portions 544 and 574, respectively. The upper portions 543 or 573 of each of the mounting contacts are electrically connected or coupled to its respective lower portion 544 or 574. Each of the mounting contact portions 543, 544, 573 and 574 are substantially the same size and shape, and have a given length dimension of about 0.020 inches and a given width dimension of about 0.027 inches. The mounting contacts 542 and 572 are oriented in a predetermined pattern about the center line 520 and are otherwise positioned at their respective ends 514 or 515 of crystal strip 510. The flags 545 and 575 are substantially the same size and shape, and further have, a given length dimension of about 0.018 inches and a given width dimension of about 0.015 inches.

The ground electrodes 581 and 591 are formed on or otherwise borne by the lower surface 513 of crystal strip 510. This is best shown by reference to FIG. 28. Each of the ground electrodes 581 and 591 is electrically connected or coupled to a ground contact 600 by means of a ground flag 582 or 592, respectively. The ground electrodes 581 and 591 are substantially the same sized and shape. Each of the ground electrodes 581 and 591 is also aligned or otherwise disposed in substantial registry relative to its input and output electrodes 540 and 560. Each of the ground electrodes 581 or 591 includes a symmetry flag 583 or 593. Symmetry flags 583 and 593 have nearly identical sizes and shapes and are substantially equivalent to input and output electrode flags 545 and 575. The symmetry flags are substantially aligned or otherwise disposed in substantial registry with the respective input and output electrode flags. The symmetry flags 583 and 593 are shorter than input and output electrode flags 545 and 575 and do not physically contact the lower portions 544 and 554 of mounting contacts 542 or 552. The ground electrodes 581 and 591 and their respective symmetry flags 583 and 593 are positioned in a substantial symmetrical pattern about the center line 520. The ground electrodes 581 and 591; the flags 582 and 592; and the symmetry flags 583 and 593 are also located in a substantial symmetrical pattern about the line of symmetry 530. Although each ground electrode 581 and 591 has been shown and described as being an integral electrode positioned in substantially spaced parallel registry relative to both of its respective input and output electrodes 541 and 551 or 561 and 571, it should be understood that each ground electrode 581 or 591 could be split or otherwise divided to form four separate ground electrodes, each separate ground electrodes being positioned or otherwise located in substantial registry relative to one input or output electrode without departing from the invention.

The ground contact 600 includes an upper portion 601 which is formed on the upper surface 512 of the crystal strip and a lower portion 602 which is formed on the lower surface 513 of the crystal strip and which is oriented in substantial registry relative to the upper portion 601. The lower portion 602 is aligned in substantial registry with upper portion 601. The upper portion 601 is electrically connected to lower portion 602 by electrically conductive cement applied when securing the ground member which is preferably a wire 620 to the filter 500 as discussed below. Ground contact 600 is substantially centered on line of symmetry 530 and is located proximal strip side 516.

A ground shield 610 extends from ground contact 600 and extends along the line of symmetry 530. The ground shield 610 includes an upper portion 612 which is formed on the upper surface 512 of the crystal strip and a lower portion 613 which is formed on the lower surface 513 of the strip in substantial registry with upper portion 612. The ground shield 610 is substantially centered on line of symmetry 530 and is located proximal strip side 516.

The monolithic filter 500 as described above includes a crystal strip 410 and various elements which have been numerically designated by the numbers 540–613. These elements are arranged in a predetermined configuration or pattern across the surfaces 512 and 513 of the crystal strip 510 to produce a four-pole filter having a minimum amount of spurious responses and insertion losses. The elements disposed on the upper and lower surfaces 512 and 513 of the crystal strip 510 are arranged in roughly the following configurations:

| Configuration of Four-Pole Strip Filter 500 | | |
| --- | --- | --- |
| ELEMENT | X-AXIS | Y-AXIS |
| Upper Surface 512 | | |
| Mounting Contact 543 | 0.00 to 0.90 | 0.24 to 0.76 |
| Electrode Flag 545 | 0.90 to 0.17 | 0.36 to 0.64 |
| Electrode 541 | 0.17 to 0.25 | 0.24 to 0.76 |
| Electrode 551 | 0.29 to 0.38 | 0.24 to 0.76 |
| Connector Flag 552 | | |
| Angled portion 553 | 0.38 to 0.44 | 0.76 to 0.81 |
| Linear strip 554 | 0.44 to 0.56 | 0.81 to 0.10 |

-continued

Configuration of Four-Pole Strip Filter 500

| ELEMENT | X-AXIS | Y-AXIS |
| --- | --- | --- |
| Angled portion 555 | 0.56 to 0.62 | 0.76 to 0.81 |
| Electrode 561 | 0.62 to 0.71 | 0.24 to 0.76 |
| Electrode 571 | 0.75 to 0.83 | 0.24 to 0.76 |
| Electrode Flag 575 | 0.83 to 0.91 | 0.36 to 0.64 |
| Mounting Contact 573 | 0.91 to 0.10 | 0.24 to 0.76 |
| Ground Contact 601 | 0.22 to 0.78 | 0.00 to 0.10 |
| Ground Shield 612 | 0.47 to 0.53 | 0.10 to 0.76 |
| Lower Surface 513 | | |
| Mounting Contact 544 | 0.00 to 0.90 | 0.24 to 0.76 |
| Symmetry Flag 583 | 0.12 to 0.17 | 0.36 to 0.64 |
| Ground Electrode 581 | 0.17 to 0.38 | 0.24 to 0.76 |
| Ground Electrode 591 | 0.62 to 0.83 | 0.24 to 0.76 |
| Ground Symmetry Flag 593 | 0.83 to 0.88 | 0.36 to 0.64 |
| Mounting Contact 574 | 0.91 to 0.10 | 0.24 to 0.76 |
| Ground Contact 602 | 0.22 to 0.78 | 0.00 to 0.10 |
| Ground Flag 582 | 0.22 to 0.26 | 0.10 to 0.24 |
| Ground Flag 592 | 0.74 to 0.78 | 0.10 to 0.24 |
| Ground Shield 613 | 0.42 to 0.58 | 0.10 to 0.76 |

To achieve a center frequency of about 72.45 MHz, the strip 310 is about 0.002691 inches thick and the plated elements are about 0.000009705 inches thick on each side of the strip. It is believed that filter 500 will achieve an output signal performance similar to filter 300 except that it will have a 3 dB bandwidth of about 15 KHz given the 0.008 spacing of signal electrodes 541 and 551, and 561 and 571. Again, other center frequencies between the range of 4 to 500 MHz and bandwidths between the range of 3 to 250 kHz should be obtainable by varying the thickness of the strip and plated elements, and the separation between and length of the electrodes.

Manufacture of Filter and Filter Package

One method of manufacturing the respective crystal strips 110, 210, 310 and 510 is to cut a number of similarly shaped strips from a single large plate of crystal. A mask may then be used to apply a plated silver coating to surfaces 112 and 113 to form filters the elements. However, it should be understood that other metalized coatings such as gold, aluminum, etc., could be used. Another way to manufacture crystal strips filters 100, 200, 300 and 500 is to employ a photolithographic process to cut and metalize the discrete crystal strip filters.

The monolithic crystal strip filter package 10 is assembled by mounting the individual strip filters 100, 200, 300 or 500 on the individual posts 40 and 50 of base 20, securing the ground wire 180, 280, 420 or 620 and attaching the can 70 to form the hermetic seal around the filter. First strip filter 100, 200, 300 or 500 is secured to mounting posts 40 and 50 by use of a conductive cement. The cement is applied to the highest horizontal step of posts 40 and 50. The crystal filter 100, 200, 300 or 500 is then centered over the upper surface 22 of the base 20, and each end of the filter is placed on its respective mounting post step 40 and 50. Cement may then be applied over the upper portion of each mounting contact. The cement is flowed to connect the crystal strip 110, 210, 310 or 510 to the mounting posts. Although crystal strips 110, 210, 310, or 510 have been shown and described as having signal electrodes on the upper or first 112, 212, 312, or 512 and ground electrodes on the lower or second surface 113, 213, 313, or 513, it should be understood that the crystal strip could be turned over so that the upper surface becomes the lower or second surface, and the lower surface becomes the upper or first surface.

Ground wire 180, 280, 420 or 620 can now be installed. This is done by cementing, soldering or spot welding one end 181, 281, 421 or 621 of the ground wire to the upper or lower surface 22 or 23 of the base 20 at a point between mounting posts 40 and 50. Once secured to the base 20, the other end 182, 282, 422 or 622 of the ground wire is cemented to the lower portion 166, 266, 366 or 566 of ground contact 165, 265, 365 or 565. The can 70 is then secured to the flange 29 of base 20 to form a hermetic seal enclosing strip filter 100, 200, 300 or 500. This can be done by compression fitting the can 70 to base 20 or by use of a standard solder or cement product.

Although the low profile monolithic crystal strip filters 100, 200, 300 and 500 have been shown and described as being sized to fit inside an HC-45 or HC-49 base, it should be understood that other bases could be used, and that as the length and width of the surface of the base increase or decrease the length and width of the crystal strip 110, 210, 310 or 510 may increase or decrease. In addition, although the present invention is shown and described as having a base with a through-hole design wherein the lower portions 41 and 51 of posts 40 and 50 and the ground post 60 extend perpendicularly from the lower surface 23 of base 20, it should be understood that the base may incorporate a surface mount design as in FIGS. 29 and 30 wherein the lower portions 41 and 51 of posts 40 and 50 are bent to lay flat against a strip of insulation tape 33 applied to the lower surface of the base. The ground post 60 may take any of a variety of forms grounding the base to the circuit board.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

Having described my invention, what I claim as new and desire to secure by Letters Patent of the United States is:

1. A low profile monolithic crystal strip filter package comprising:

a base having a main body and first and second mounting posts;

a quartz crystal strip mounted substantially parallel to the main body of the base, and wherein the strip has first and second surfaces, first and second ends and first and second sides, and wherein the sides of the strip are substantially longer than the ends of the strip;

a first signal electrode located on the first surface of the strip and in electrical communication with a first mounting contact, and wherein the first mounting contact is in electrical communication with the first mounting post;

a second signal electrode located on the first surface of the strip and in electrical communication with a second mounting contact, and wherein the second mounting contact is in electrical communication with the second mounting post;

a ground electrode located on the strip in substantial registry with at least one signal electrode, and wherein the ground electrode is in electrical communication with a ground contact; and, a ground member in electrical communication with the ground contact, and wherein the output signal of the strip filter has a 3 dB bandwidth in the range of about 3 to 250 kHz at a center frequency in the range of about 10 to 150 MHz.

2. The low profile monolithic crystal strip filter package of claim 1, and wherein the base includes a ground post in electrical communication with the ground member.

3. The low profile monolithic crystal strip filter package of claim 2, and wherein the ground member is an electrical conductor having one end electrically coupled to the main body of the base and another end electrically coupled to the ground contact.

4. The low profile monolithic crystal strip filter package of claim 3, and wherein the crystal strip is substantially rectangular in shape.

5. The low profile monolithic crystal strip filter package of claim 4, and wherein the sides of the strip have given length dimensions and the ends of the strip have given width dimensions, and wherein the length dimensions are at least about three times the width dimensions.

6. The low profile monolithic crystal strip filter package of claim 5, and wherein the length dimension is about 0.32 inches, the width dimension is about 0.10 inches, and wherein the base is an HC-49 base.

7. The low profile monolithic crystal strip filter package of claim 5, and wherein the length dimension is about 0.23 inches, the width dimension is about 0.05 inches, and wherein the base is an HC-45 base.

8. The low profile monolithic crystal strip filter package of claim 7, and wherein the strip is divided into first and second portions by a dividing line, and wherein the first signal electrode is located proximal the dividing line on the first portion of the strip and the second signal electrode is located proximal the dividing line on the second portion of the strip.

9. The low profile monolithic crystal strip filter package of claim 8, and wherein the first mounting contact is located at the first end of the strip, the second mounting contact is located at the second end of the strip, and the ground contact is located along the first side of the strip and intermediate the first and second ends of the strip.

10. The low profile monolithic crystal strip filter package of claim 9, and wherein the first mounting post is located proximal the first end of the base and the second mounting post is located proximal the second end of the base, and the ground member is located intermediate the first and second ends of the base.

11. The low profile monolithic crystal strip filter package of claim 5, and wherein the electrodes are located within a distance of about five to ten times the thickness of the strip from one side of the strip.

12. The low profile monolithic crystal strip filter package of claim 11, and wherein the ground contact is located about 0.020 inches from the signal electrodes.

13. The low profile monolithic crystal strip filter package of claim 1, and further including a low profile can that matingly engages the main body of the base to enclose the strip.

14. A monolithic crystal strip filter comprising:

a quartz crystal strip having first and second surfaces, first and second ends and first and second sides, and wherein the strip has a length dimension defined by the sides and a width dimension defined by the ends, and wherein the length dimension is substantially longer than the width dimension, and wherein the length of the strip defines an x-axis having coordinates ranging from 0.0 at the first end of the strip to 1.0 at the second end of the strip, and wherein the end of the strip defines a y-axis having coordinates ranging from 0.0 at the first side of the strip to 1.0 at the second side of the strip;

a first mounting contact borne by the first surface of the strip and oriented in a location from about 0.0 to about 0.1 along the x-axis;

a second mounting contact borne by the first surface of the strip and oriented in a location from about 0.9 to about 1.0 along the x-axis;

a first signal electrode borne by the first surface of the strip and oriented in a location from about 0.4 to about 0.5 along the x-axis, and wherein the first signal electrode is in electrical communication with the first mounting contact;

a second signal electrode borne by the first surface of the strip and oriented in a location from about 0.5 to about 0.6 along the x-axis, and wherein the second signal electrode is in electrical communication with the second mounting contact, and wherein the respective mounting contacts and signal electrodes are located from about 0.4 to about 0.6 along the y-axis;

a ground contact borne by the second surface of the strip and oriented in a location between about 0.1 to about 0.9 along the x-axis, and wherein the ground contact is oriented in a location from about 0.0 to about 0.1 along the y-axis; and, a ground electrode born by the second surface of the strip and disposed in substantial registry with at least one of the signal electrodes, and wherein the ground electrode is disposed in electrical communication with the ground contact.

15. The monolithic crystal strip filter of claim 14, and wherein the length dimension is at least about three times longer than the width dimension.

16. The monolithic crystal strip filter of claim 15, and wherein the length dimension is about three to five times longer than the width dimension.

17. The monolithic crystal strip filter of claim 16, and wherein the side of the strip defines the x-axis, and wherein the strip is substantially rectangular in shape.

18. The monolithic crystal strip filter of claim 17, and wherein the respective sides are about 0.32 inches in length and the respective ends are about 0.10 inches in length.

19. The monolithic crystal strip filter of claim 17, and wherein the respective sides are about 0.23 inches in length and the respective ends are about 0.05 inches in length.

20. The monolithic crystal strip filter of claim 14, and wherein the electrodes and contacts are electrically connected by flags borne by the surfaces of the strip.

21. The monolithic crystal strip filter of claim 20, and wherein the ground electrode includes first and second ground electrodes, and wherein the first ground electrode is disposed in substantial registry with the first signal electrode and the second ground electrode is disposed in substantial registry with the second signal electrode.

22. The monolithic crystal strip filter of claim 21, and wherein the strip has a center line located at about 0.5 along the y-axis and extending from 0.0 to 1.0 along the x-axis, and wherein the electrodes, mounting contacts and flags are located substantially symmetrically about the center line.

23. The monolithic crystal strip filter of claim 22, and wherein the first ground electrode includes a symmetry flag borne by the second side of the strip and which is oriented at a location extending from about 0.2 to about 0.3 along the x-axis, and wherein the second ground electrode includes a symmetry flag borne on the second surface of the strip and which is oriented at a location from about 0.7 to about 0.8 on the x-axis.

* * * * *